(12) United States Patent
Shinriki et al.

(10) Patent No.: US 6,428,850 B1
(45) Date of Patent: Aug. 6, 2002

(54) SINGLE-SUBSTRATE-PROCESSING CVD METHOD OF FORMING FILM CONTAINING METAL ELEMENT

(75) Inventors: Hiroshi Shinriki, Kofu; Yijun Liu, Nakakoma-gun; Masahito Sugiura, Nirasaki, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/613,694

(22) Filed: Jul. 10, 2000

Related U.S. Application Data

(62) Division of application No. 09/310,132, filed on May 12, 1999, now Pat. No. 6,126,753.

(30) Foreign Application Priority Data

May 13, 1998 (JP) .............................. 10-148343
Sep. 10, 1998 (JP) .............................. 10-274354

(51) Int. Cl.⁷ .................... C23C 16/06; C23C 16/18; C23C 16/455
(52) U.S. Cl. .................. 427/255.32; 427/255.28; 427/255.31; 427/255.35; 427/255.36; 118/715
(58) Field of Search ................ 118/715; 427/248.1, 427/250, 255.28, 255.32, 255.36, 255.31, 255.35; 239/548, 549, 553.3, 553.5, 558

(56) References Cited

U.S. PATENT DOCUMENTS

| | | | | |
|---|---|---|---|---|
| 5,572,052 A | * | 11/1996 | Kashihara et al. | 257/295 |
| 5,618,761 A | * | 4/1997 | Eguchi et al. | 438/785 |
| 6,090,210 A | * | 7/2000 | Ballance et al. | 118/725 |
| 6,136,725 A | * | 10/2000 | Loan et al. | 438/758 |

* cited by examiner

*Primary Examiner*—Shrive P. Beck
*Assistant Examiner*—Wesley Markham
(74) *Attorney, Agent, or Firm*—Oblon, Spivak, McClelland, Maier & Neustadt, P.C.

(57) ABSTRACT

A single-substrate-processing CVD apparatus is used for forming a BST thin film on a semiconductor wafer while supplying a first process gas containing a mixture of Ba(thd)$_2$ and Sr(thd)$_2$, and a second process gas containing Ti(O-iPr)(thd)$_2$ or Ti(thd)$_2$. Precursors of Ba and Sr have lower activation energies and higher resistivities than precursors of Ti. The first and second process gases are supplied from a shower head which has a group of first spouting holes for spouting the first process gas and a group of second spouting holes for spouting the second process gas. The group of the second spouting holes are designed to have diameters gradually decreasing in radial directions outward from the center of a shower region, such that the second process gas is supplied at a spouting rate gradually decreasing in radial directions outward from the center.

9 Claims, 10 Drawing Sheets

SINGLE-SUBSTRATE-PROCESSING CVD METHOD OF FORMING FILM CONTAINING METAL ELEMENT

This application is a division of application Ser. No. 09/310,132 filed on May 12, 1999, now U.S. Pat. No. 6,126,753.

BACKGROUND OF THE INVENTION

The present invention relates to a single-substrate-processing CVD (Chemical Vapor Deposition) apparatus and method, and particularly to an apparatus and method for growing an insulating, high-dielectric, or ferroelectric film by means of MOCVD (Metal Organic Chemical Vapor Deposition).

In order to manufacture semiconductor devices, film formation and pattern etching are repeatedly applied to a semiconductor wafer. As semiconductor devices are increasingly highly miniaturized and integrated, demands on the film formation become more strict. For example, very thin insulating films, such as capacitor insulating films and gate insulating films are still required to be thinner and to be more insulating.

Conventionally, silicon oxide films and silicon nitride films are used as the insulating films. In recent years, however, it has been proposed to form the insulating films from materials having more excellent insulating properties, such as metal oxides, e.g., tantalum oxide ($Ta_2O_5$), or high-dielectric or ferroelectric bodies containing two metal elements or more, e.g., $(Ba,Sr)TiO_3$, i.e., BST. These films can be formed by means of MOCVD, i.e., using vaporized metal organic compounds.

When a film is formed by means of CVD, it is important to maintain a high planar uniformity in the film thickness, in light of attaining a high yield and the like. For this reason, process gases are supplied from gas spouting holes arranged at uniformly distributed positions on a shower head, so that the process gases are uniformly supplied onto the surface of a wafer. Where a CVD process is performed to form a film of a two-element material including only one metal or semiconductor element, represented by $SiO_2$ or TiN, it is possible to maintain a high planar uniformity in the film thickness by such a shower head.

According to experiments conducted by the present inventors, however, where a CVD process is performed to form a film of a composite material including two metal elements or more, such as a BST thin film, planer uniformity in the film composition is sometimes lowered by this conventional CVD process. Like planar uniformity in the film thickness, planar uniformity in the film composition, i.e., the ratio of metal elements, is also an important issue, in light of attaining a high yield and maintaining electric properties.

Further, where a tantalum oxide film is formed by means of MOCVD, a raw material gas containing tantalum alkoxide, and oxygen gas are used. In this case, reaction byproducts, such as organic substances, e.g., $CH_3CHO$, are slightly mixed into the tantalum oxide film, thereby deteriorating the film's properties, such as the insulation breakdown voltage.

BRIEF SUMMARY OF THE INVENTION

An object of the present invention is to provide a single-substrate-processing CVD apparatus and method which can improve planar uniformity in film composition, where a film of a composite material including two metal elements or more is formed.

Another object of the present invention is to provide a single-substrate-processing CVD apparatus and method which can reduce the amount of reaction byproducts contained in a film to be formed by means of CVD.

According to a first aspect of the present invention, there is provided a single-substrate-processing CVD apparatus for forming a thin film containing first and second metal elements on a target substrate while supplying first and second process gases containing the first and second metal elements, respectively, a precursor of the first metal element produced by dissociation of the first process gas having a lower activation energy and a higher resistivity than a precursor of the second metal element produced by dissociation of the second process gas, the apparatus comprising:

an airtight process chamber;

a worktable arranged in the process chamber to mount the target substrate thereon;

an exhaust system configured to exhaust the process chamber; and a supply system having a shower head configured to supply the first and second process gases into the process chamber, wherein the shower head has a shower region facing the worktable, on which a group of first spouting holes for spouting the first process gas and a group of second spouting holes for spouting the second process gas are arranged, and wherein the supply system is designed such that the first process gas is supplied at a spouting rate substantially uniform over the shower region, and the second process gas is supplied at a spouting rate gradually decreasing in radial directions outward from a center of the shower region.

According to a second aspect of the present invention, there is provided a single-substrate-processing CVD method of forming a thin film containing first and second metal elements on a target substrate while supplying first and second process gases containing the first and second metal elements, respectively, a precursor of the first metal element produced by dissociation of the first process gas having a lower activation energy and a higher resistivity than a precursor of the second metal element produced by dissociation of the second process gas, the method comprising:

placing the target substrate on a worktable arranged in an airtight process chamber; and forming the thin film on the target substrate by supplying the first and second process gases into the process chamber from a shower region facing the worktable while exhausting the process chamber, wherein the first process gas is supplied at a spouting rate substantially uniform over the shower region, and the second process gas is supplied at a spouting rate gradually decreasing in radial directions outward from a center of the shower region.

According to a third aspect of the present invention, there is provided a single-substrate-processing CVD apparatus for forming a thin film containing a metal element on a target substrate while supplying first and second process gases containing the metal element and a non-metal element for combining with the metal element, respectively, the apparatus comprising:

an airtight process chamber;

a worktable arranged in the process chamber to mount the target substrate thereon;

an exhaust system configured to exhaust the process chamber; and a supply system having a shower head configured to supply the first and second process gases into the process chamber, wherein the shower head has a shower region facing the worktable, on which a group of first spouting holes for spouting the first process gas and a group of second spouting holes for spouting the second process gas are arranged, and wherein the group of the first spouting holes are arranged to distribute in a first zone having a surface area substantially smaller than a surface area of the target substrate facing the shower region, and the group of the second spouting holes are arranged to distribute in a second zone concentric with the first zone and having a surface area substantially the same as or larger than the surface area of the target substrate.

According to a fourth aspect of the present invention, there is provided a single-substrate-processing CVD method of forming a thin film containing a metal element on a target substrate while supplying first and second process gases containing the metal element and a non-metal element for combining with the metal element, respectively, the method comprising:

placing the target substrate on a worktable arranged in an airtight process chamber; and forming the thin film on the target substrate by supplying the first and second process gases into the process chamber from a shower region facing the worktable while exhausting the process chamber, wherein the first process gas is supplied from a first zone having a surface area substantially smaller than a surface area of the target substrate facing the shower region such that the first process gas is supplied at a spouting speed higher than a spouting speed at which the first process gas would be supplied from a zone having the same surface area as the surface area of the target substrate when an equal supply rate is used, and the second process gas is supplied from a second zone concentric with the first zone and having a surface area substantially the same as or larger than the surface area of the target substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the process of developing the present invention, the present inventors conducted research on the reasons as to why a CVD film containing a plurality of metal elements, such as a BST film, entailed a low planar uniformity in the film composition. As a result, the present inventors have obtained the following findings.

Where a composite material thin film is formed by means of CVD, a plurality of process gases need to be supplied into a CVD process chamber and simultaneously cause a film deposition reaction on the surface of a wafer. However, raw material gases do not necessarily have the same or similar reactivity. Where raw material gases having higher and lower resistivities are supplied onto the surface of a wafer while they are mixed and spouted from spouting holes having a uniform diameter distribution, the formed film has a low planar uniformity in the film composition.

Especially, where a BST thin film is formed on a wafer, planar uniformity in the film composition becomes lower with a decrease in the film deposition temperature, such that the film is gradually Ti enriched from the center to the edge of the wafer. In recent practical processes, film deposition tends to be performed under a lower temperature to attain an excellent step coverage. As a result, planar uniformity in the film composition tends to be lowered, and so does planar uniformity in the film properties.

According to an analysis on the film deposition mechanism of BST-CVD conducted by the present inventors, it has been found that precursors of Ti have activation energies far higher than those of precursors of Ba and Sr in the film deposition reaction. Accordingly, the growth rate of Ti is reduced with a decrease in temperature. On the other hand, $(Ba,Sr)TiO_3$ is formed of a solid solution of $BaTiO_3$ and SrTiO$_3$, and thus should have a stoichiometric ratio of (Ba+Sr):Ti=1:1. In other words, where this substance is formed by means of CVD, it is necessary to cause Ti to have a growth rate higher than each one of those of Ba and Sr, and equal to the sum of those of Ba and Sr. For this reason, a raw material gas for Ti has to be supplied in large quantities.

Figure 7:
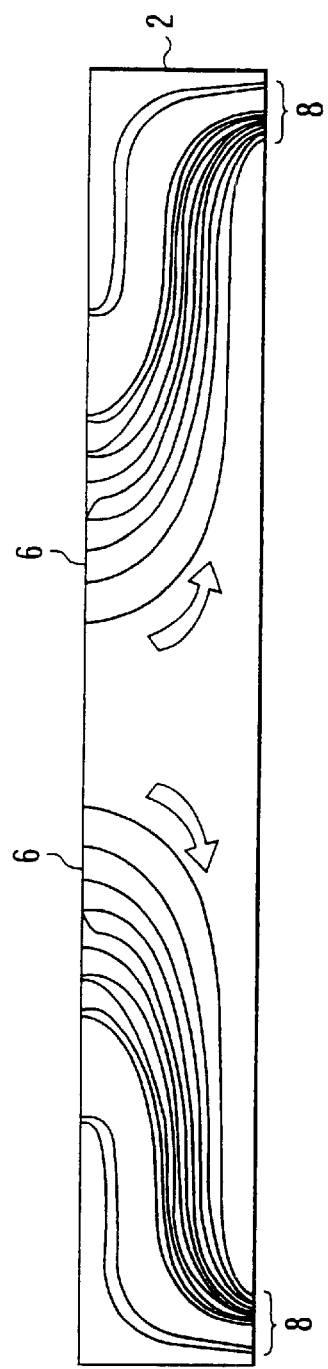
FIG. 7 is a view showing the flow of all the gases in a process chamber.

Further, the present inventors have found the following phenomena by simulating the flow and concentration distribution of gases between a shower head and the surface of a wafer, where a CVD process is performed to form a film of a two-element material including only one metal or semiconductor element, represented by SiO$_2$ or TiN. Specifically, as shown in FIG. 7, where gas spouting holes arranged on a shower head 6 have the same diameter, the flow rates of process gases from the spouting holes are equal to each other, when the process gases are supplied into a process chamber 2. The process gases reach the surface of a wafer by flow and diffusion in a vertical direction from the shower head 6 to the wafer surface, then perform a film deposition reaction on the wafer surface. The inside atmosphere in the process chamber is exhausted from exhaust ports 8 arranged around a worktable, so that the process gases partly flows in lateral directions. As a result, the flow of all the gases in the process chamber 2 is formed as shown in FIG. 7. Flow rates of gases in lateral directions due to gas exhaust are smaller at the center of the shower head 6 than at positions near the edge.

Incidentally, in order to obtain a high deposition rate, it is necessary to supply a great amount of the raw material gases into the process chamber to increase the gas concentration on the wafer surface. In this case, the process gases supplied on the wafer surface are not completely consumed, so non-reacted parts of the process gases flow outward in parallel to the wafer surface so as to join gases flowing downward from the shower head 6 and to perform a film deposition reaction. The gases supplied from spouting holes on the periphery of the shower head 6 are imparted with high flow rates in lateral directions due to gas exhaust, thereby reducing the amount which reaches the periphery of the wafer surface. Seemingly, the growth rate of the film on the periphery of the wafer surface is smaller than that on the center of the wafer surface. But, that is not the case, because non-reacted parts of the process gases flowing from the center join the gases flowing from above, and compensate for the gas concentration to maintain the growth rate of the film.

In the case of a film of a two-element material, such as SiO$_2$ or TiN, a high planar uniformity in the film thickness can be obtained, if a uniform concentration of raw material gases and a uniform temperature are held on the surface of a wafer. However, in the case of a film of a composite material represented by BST, not only planar uniformity in the film thickness, but also planar uniformity in the film composition has to be maintained high.

Figure 8:
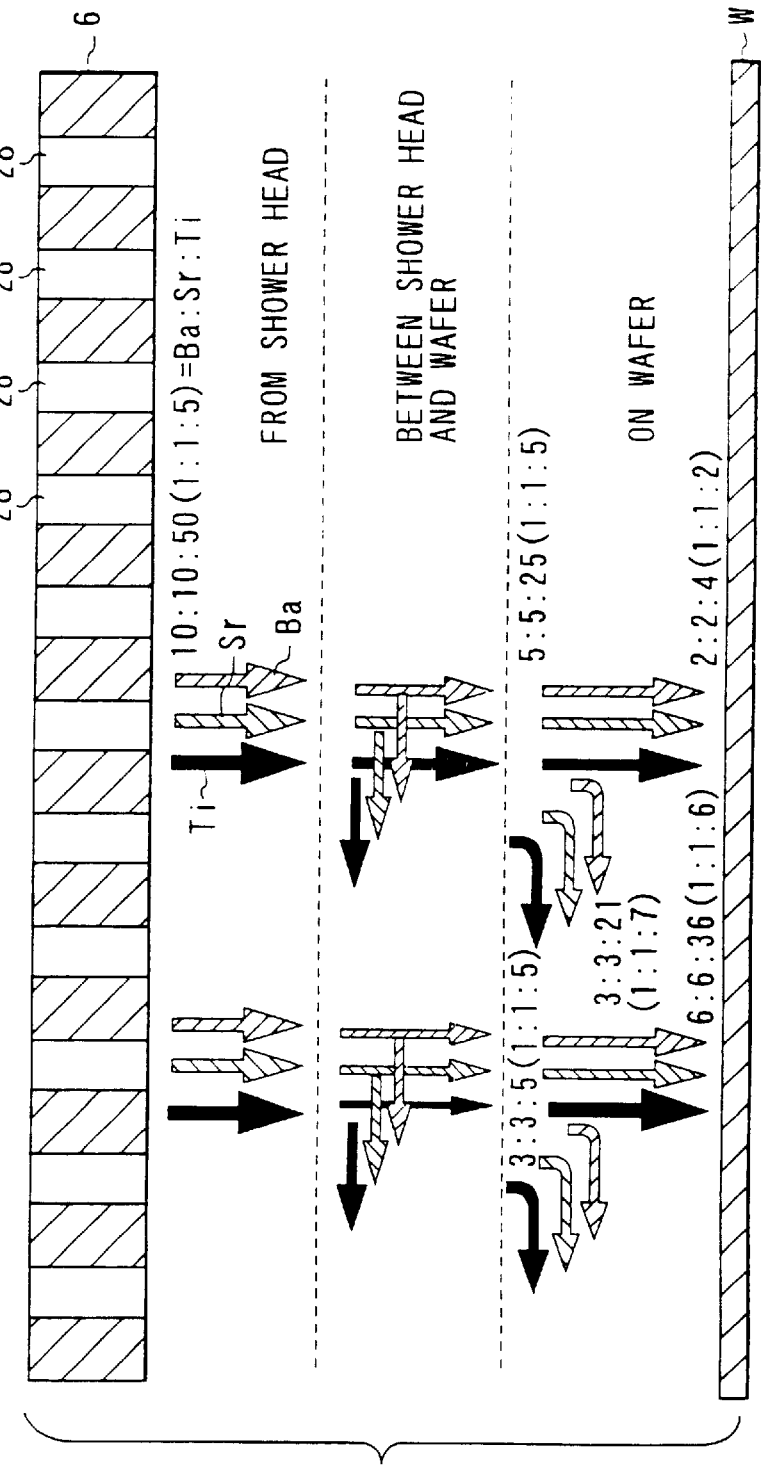
FIG. 8 is a view showing the flow and composition change of process gases where a thin film of a composite material is formed by a conventional method.

FIG. 8 is a view showing the flow and composition change of process gases where raw material gases for Ba, Sr, and Ti are mixed with each other in advance, and supplied from spouting holes 28 on a shower head 6 into a process chamber at a constant rate. As shown in FIG. 8, the process gases at the center of maintain their original composition. However, precursors of the metals have different activation energies in the film deposition reaction, depending on the metals, and thus present different deposition rates and different reaction transforming ratios, thereby changing the composition of non-reacted parts of the process gases. On the way to the edge of the wafer along the wafer surface, the non-reacted gases join the gases flowing downward from the shower head 6, and change the composition of the gases flowing downward. As a result, the film formed on the wafer comes to have different film compositions between the center and periphery of the wafer.

This problem will be explained in detail with reference to the numerical values shown in FIG. 8. In FIG. 8, the numerical values shown not in parentheses denote flow rate ratios of the process gases, while the numerical values shown within parentheses denote composition ratios of the metal elements. Precursors of Ti have far higher activation energies and lower reactivities, than precursors of Ba and Sr. Accordingly, the raw material gas for Ti is supplied in large amounts, so that Ti has a growth rate two times larger than each one of those of Ba and Sr. With a decrease in temperature, the reaction rate of Ti film deposition is lowered, and the excessive amount of the raw material gas for Ti becomes larger.

For example, it is supposed that the process gases are supplied from the shower head 6 to the wafer at ratios in the flow rate and composition of Ba:Sr:Ti=10:10:50 (1:1:5). In light of mass transfer in lateral directions by flow and diffusion, the process gases reach the center of the wafer surface at ratios in the rate and composition of Ba:Sr:Ti= 5:5:25 (1:1:5). Namely, the gas concentration decreases, but the composition is maintained. Further, it is supposed in this case that mass transfer of the process gases is performed in a non-dissociated state of the raw material gases for Ba, Sr, and Ti, because the temperature other than that on the wafer surface is low, and dissociation of the process gases can not be caused. It is also supposed that the raw material gases for Ba, Sr, and Ti diffuse and flow in lateral directions at the same rate, because the raw material gases have almost the same molecular weight and similar molecular structures, and thus have similar diffusion coefficients.

If the film formed at the center of the water has a ratio in the composition of Ba:Sr:Ti=1:1:2, and the process gases are consumed at a ratio of Ba:Sr:Ti=2:2:4 in the film deposition reaction at the center of the wafer, the process gases are left non-reacted at ratios in the rate and composition of Ba:Sr:Ti=3:3:21 (1:1:7). The non-reacted process gases flow outward in parallel to the wafer surface.

The process gases spouted from the spouting holes 28 located between the center and periphery of the shower head 6 receive forces in lateral directions stronger than those to the gases at the center of the shower head 6. Accordingly, the process gases spouted from the spouting holes at the in-between positions reach the wafer surface at the same composition, but at a smaller rate, as compared to the center. If the process gases reach the wafer surface at ratios in the rate and composition of Ba:Sr:Ti=3:3:15 (1:1:5), they join the non-reacted process gases from the center to form ratios in the rate and composition of Ba:Sr:Ti=6:6:36 (1:1:6). As a result, the in-between positions on the wafer surface are provided with a sufficient amount of gases with the supplement from the center, but is provided with a gas composition different from the original. Since the provided gases thereon are richer in Ti than the original, the composition of a film to be formed thereon is also richer in Ti than that on the center. Such a phenomenon is repeatedly caused from the center to the edge of the wafer surface, so the composition of the formed film ends up in being richer in Ti at a position closer to the periphery of the wafer. Further, as described above, with a decrease in temperature, the raw material gas for Ti needs to be supplied in large amounts, but the growth rate of Ti is slower, so the excessive rate of Ti is increasingly greater.

Embodiments of the present invention that are made on the basis of these findings will be described hereinafter with reference to the accompanying drawings. In the following description, the constituent elements having substantially the same function and arrangement are denoted by the same reference numerals, and a repetitive description will be made only when necessary.

Figure 1:
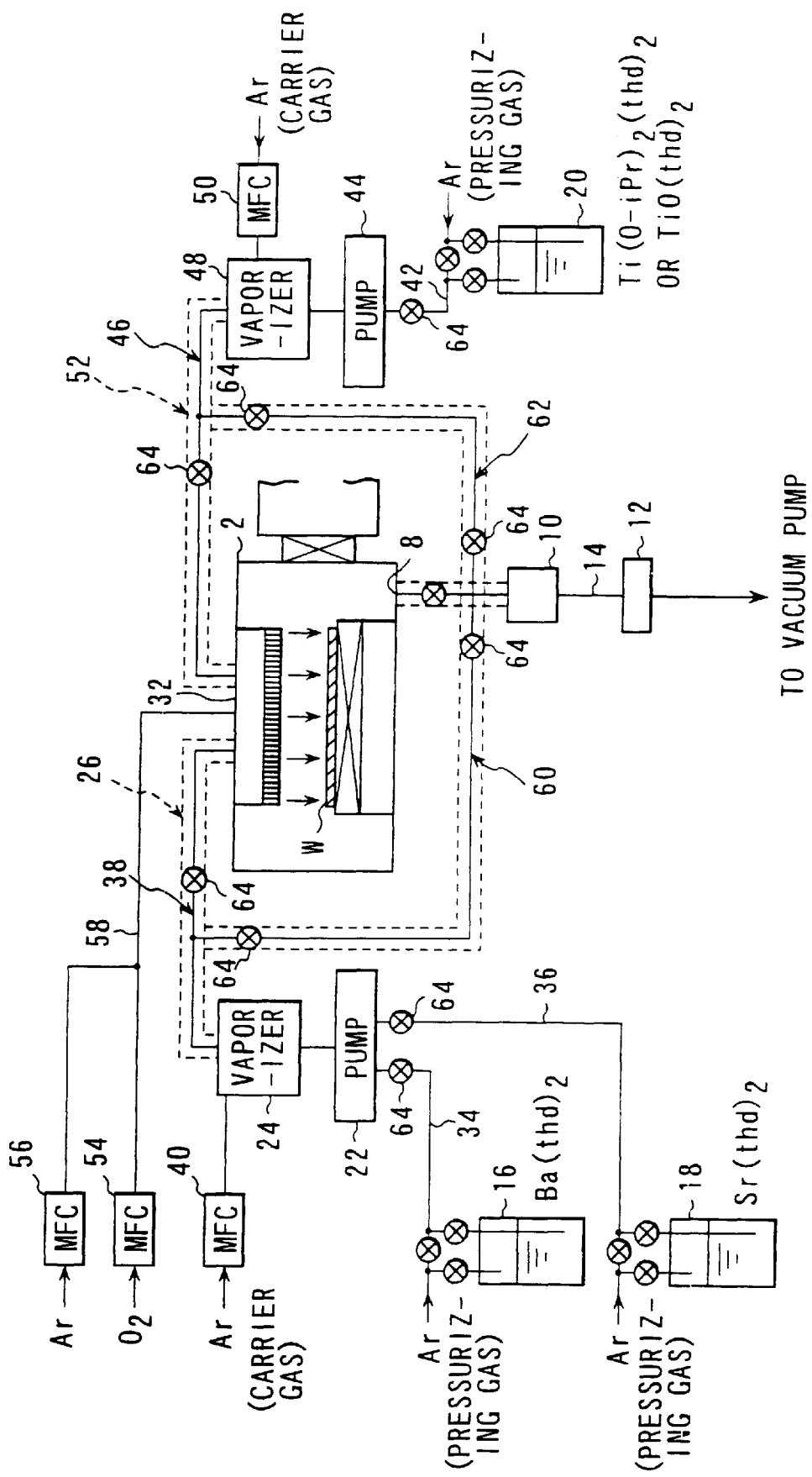
FIG. 1 is a diagram schematically showing a CVD apparatus according to a first embodiment of the present invention.

FIG. 1 is a diagram schematically showing a CVD apparatus according to a first embodiment of the present invention.

As shown in FIG. 1, the CVD apparatus includes a process chamber 2 formed of a cylinder of, e.g., aluminum. A worktable 4 is arranged in the process chamber 2, for mounting a semiconductor wafer W as a target object. A shower head 32 is arranged on the ceiling of the process chamber 2, for supplying process gases into the process chamber 2. Exhaust ports 8 are formed in the bottom of the process chamber, for exhausting used gases. The exhaust ports 8 are connected to an exhaust line 14 which is provided with a trap 10 for removing byproducts from the exhausted gas, and a pressure adjusting valve 12 for adjusting the pressure in the process chamber 2. The process chamber 2 is vacuum-exhausted by a vacuum pump (not shown) through the exhaust line.

In this embodiment, a thin film of $(Ba,Sr)TiO_3$, i.e., a BST thin film, is formed as an example of composite material thin films. As raw materials for Ba, Sr, and Ti, the following materials dissolved in a solution of butyl acetic acid or THF=tetrahydrofuran are used. Specifically, used for Ba is $Ba(thd)_2$=bis(tetramethylheptanedionato)barium=$Ba(C_{11}H_{19}O_2)_2$. Used for Sr is $Sr(thd)_2$=bis(tetramethylheptanedionato)strontium=$Sr(C_{11}H_{19}O_2)_2$. Used for Ti is $Ti(O-iPr)_2(thd)_2$=bis(isopropoxy)bis(tetramethylheptanedionato)titanium=$Ti(C_3H_7O)_2(C_{11}H_{19}O_2)_2$, or $TiO(thd)_2$=bis(tetramethylheptanedionato)oxotitanium=$TiO(C_{11}H_{19}O_2)_2$. Precursors of Ba and Sr generated by dissociation of the raw material gases have activation energies similar to each other between Ba and Sr, and lower than those of precursors of Ti, and have reactivities higher than those of precursors of Ti. For this reason, the raw material gases for Ba and Sr are mixed with each other before being supplied, while the raw material gas for Ti is independently supplied. Further, oxygen ($O_2$) gas and argon (Ar) gas are also supplied as an oxidizing gas and a carrier gas, respectively.

Liquids of $Ba(thd)_2$, $Sr(thd)_2$, and $Ti(O-ipr)_2(thd)_2$ or $TiO(thd)_2$, are stored in tanks 16, 18, and 20, respectively, and are sent by pressure of Ar gas. Note that $Ti(O-ipr)_2(thd)_2$ is used in this embodiment.

The Ba tank 16 and the Sr tank 18 are connected to a liquid pump 22 through passages 34 and 36, respectively. The raw material liquids from the tanks 16 and 18 are mixed with each other, and sent by pressure into a gas passage 38 connected to the shower head 32. The gas passage 38 is provided with a vaporizer 24, to which Ar gas is supplied as a carrier gas, while its flow rate is controlled by a mass-flow controller 40. The mixed raw material liquids are vaporized by the vaporizer 24 to form a first process gas. The gas passage 38 is surrounded by, e.g., a tape heater 26 to heat the gas flowing through the passage 38 at the liquefying temperature or more, so that the vaporized raw materials are prevented from returning to a liquid state.

The Ti tank 20 is connected to another liquid pump 44 through a passage 42. The raw material liquid from the Ti tank 20 is sent by pressure into a gas passage 46 connected to the shower head 32. The gas passage 46 is provided with a vaporizer 48, to which Ar gas is supplied as a carrier gas, while its flow rate is controlled by a mass-flow controller 50.

The Ti raw material liquid is vaporized by the vaporizer 48 to form a second process gas. The Ti raw material gas is not mixed with the other process gas in the shower head 32, but is mixed when it is spouted into the process chamber (in a manner of so called post-mixing supply). The gas passage 46 is also provided with, e.g., a tape heater 52, so that the vaporized raw material is prevented from returning to a liquid state.

The shower head 32 is also connected to a passage 58 for supplying oxygen gas as an oxidizing gas, along with Ar gas. The flow rates of the oxygen gas and the Ar gas are controlled by mass-flow controllers 54 and 56, respectively.

The passages 38 and 46 for the raw material gases are connected to bypass passages 60 and 62, respectively, which communicate with an exhaust passage 14, so that unnecessary gases are exhausted without passing through the process chamber 2. The passages 38, 46, 60, and 62 are provided with switching valves 64 to open and close the passages, if necessary.

Argon gas having a certain pressure is supplied to each of the raw material tanks 16, 18, and 20 for storing the raw material liquids, so that the liquids of $Ba(thd)_2$, $Sr(thd)_2$, and $Ti(O-ipr)_2(thd)_2$ are sent by pressure into the passages 34, 36, and 42, respectively.

The raw material liquids for Ba and Sr are mixed together by the liquid pump 22, which also works as a flow controller, and are sent to the vaporizer 24 where they are vaporized. The raw material gases for Ba and Sr thus vaporized are mixed with Ar gas, i.e., a carrier gas, and the resultant mixed gases are supplied to the shower head 32 through the gas passage 38.

The raw material liquid for Ti is sent by the liquid pump 44, which also works as a flow controller, to the vaporizer 48 where it is vaporized. The raw material gas for Ti thus vaporized is mixed with Ar gas, i.e., a carrier gas, and the resultant mixed gases are supplied to the shower head 32 through the gas passage 46.

A necessary amount of oxygen gas is supplied as an oxidizing gas, along with Ar gas, into the shower head 32. The atmosphere inside the process chamber 2 is vacuum-exhausted through the exhaust passage 14 and kept at a predetermined pressure by the pressure adjusting valve 12.

Figure 2:
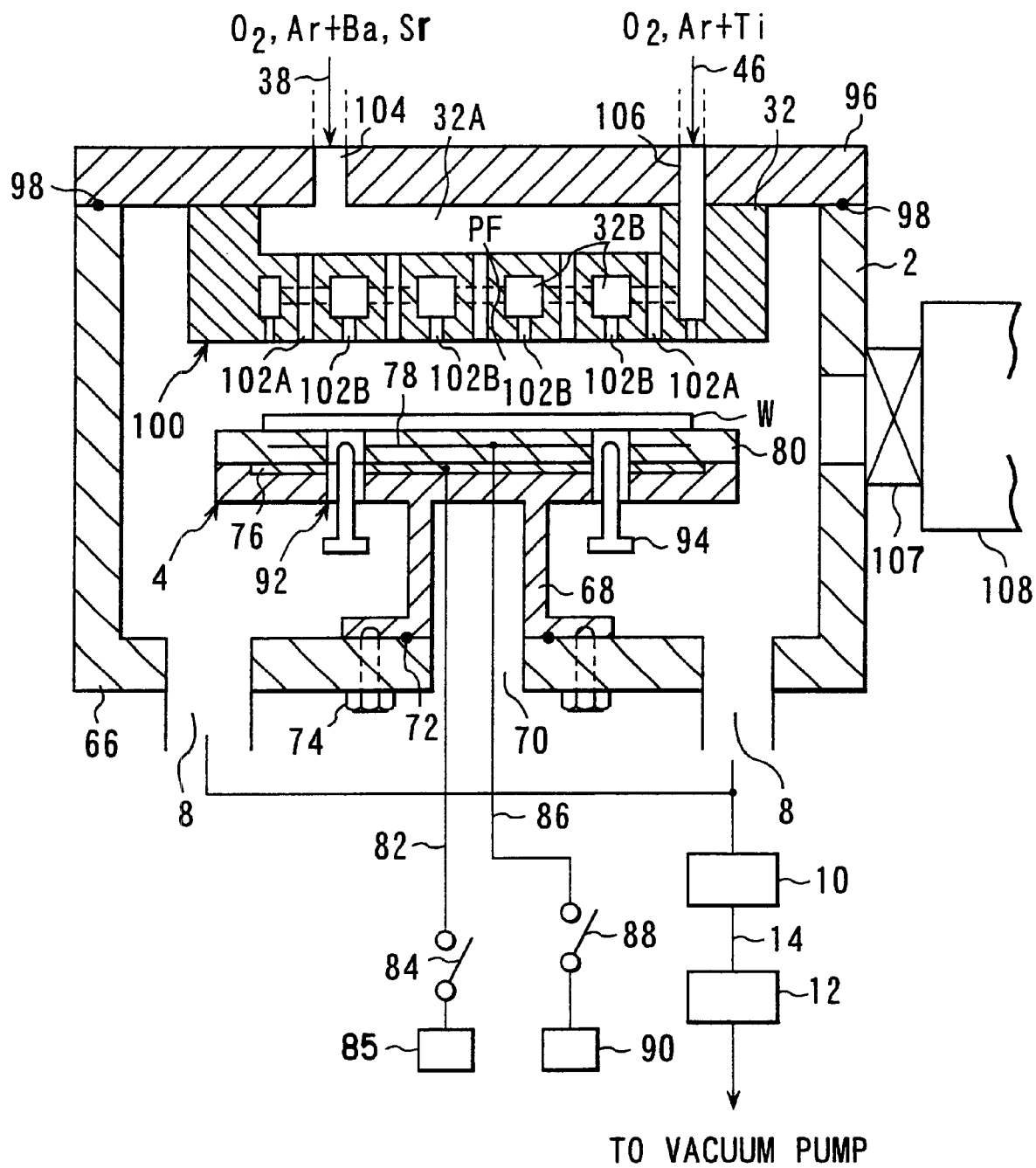
FIG. 2 is a diagram showing the main part of the CVD apparatus shown in FIG. 1.

A detailed explanation will be given to the main part of the CVD apparatus with reference to FIGS. 2 and 3.

As described above, the CVD apparatus includes he process chamber 2 formed of a cylinder of, e.g., aluminum. In the bottom 66 of the process chamber 2, there is a lead-line guide hole 70 at the center, and exhaust ports 8 at the periphery. The exhaust ports 8 are connected to the exhaust passage 14 provided with the vacuum pump (not shown), trap 10, and pressure adjusting valve.

A load lock chamber 108 capable of being vacuum-exhausted is connected to a side wall of the process chamber 2 by a gate valve 107. A semiconductor wafer W is transferred into and out of the process chamber 2 through the load lock chamber 108. The process chamber 2 and the load lock chamber 108 are connected to a mechanism (not show) for supplying $N_2$ gas for purging.

The worktable 4 arranged in the process chamber 2 is a cylindrical table made of a non-conductive material, such as alumina ($Al_2O_3$) or AlN. A leg portion 68 formed of a hollow cylinder is integratedly formed at the center of the bottom of the worktable 4 and extends downward. The lower end of the leg portion 68 is arranged to surround the guide hole 70 in the bottom 66 of the process chamber 2 and is airtightly connected and fixed to the bottom 66 by bolts 74 with a seal member 72, such as an O-ring, interposed therebetween. Consequently, the inside of the hollow leg portion 68 communicates with the outside of the process chamber 2, and is airtightly isolated from the inside of the process chamber 2.

A resistance heating body 76 is embedded in the top of the worktable 4, so that the wafer W mounted thereon can be heated to a predetermined temperature. Further, on the worktable 4, there is an electrostatic chuck 80 formed of a thin ceramic body in which an electrode 78 of, e.g., copper plate, is embedded. The wafer W is attracted and held on the top of the worktable 4 by Coulomb's force generated by the electrostatic chuck 80. A backside gas, such as He gas, is supplied between the bottom of the wafer W and the surface of the electrostatic chuck 80, so that the heat conductivity to the wafer W is improved, and film deposition on the bottom of the wafer W is prevented. In place of the electrostatic chuck 80, a mechanical clamp may be employed.

The resistance heating body 76 is connected to a lead line 82 for supplying electricity, which is insulated from the members around it. The lead line 82 is lead out to the outside of the process chamber 2 through the cylindrical leg portion 68 and the guide hole 70, without being exposed to the inside of the process chamber 2, and is connected to a power supply section 85 though a switch 84. The electrode 78 of the electrostatic chuck 80 is connected to a lead line 86 for supplying electricity, which is insulated from the members around it. The lead line 86 is lead out to the outside of the process chamber 2 through the cylindrical leg portion 68 and the guide hole 70, without being exposed to the inside of the process chamber 2, and is connected to a high-voltage DC power supply 90 though a switch 88. In place of the resistance heating body 76, a heating lamp, such as a halogen lamp, may be used for heating the wafer W.

A plurality of holes 92 are formed at positions on the periphery of the worktable 4 to penetrate the worktable 4, and lifter pins 94 are arranged in the holes 92 to be vertically movable. When the wafer W is transferred, the wafer W is moved in a vertical direction by an elevating mechanism (not shown) through the lifter pins 94. Generally, three lifter pins 94 are arranged to correspond to the periphery of the wafer W.

The shower head 32 arranged on the ceiling of the process chamber 2 has a ceiling plate 96 airtightly attached to the top of the process chamber 2 with a seal member 98, such as an O-ring, interposed therebetween. The shower head 32 faces the worktable 4 to entirely cover the top surface of the worktable 4. A process field PF is defined between the shower head 32 and the worktable 4. The shower head 32 is provided with a number of spouting holes 102A and 102B in a shower region 100 on its bottom surface.

The inside of the shower head 32 is divided into two spaces, i.e., a space 32A for Ba and Sr, and a space 32B for Ti. The space 32A for Ba and Sr has a port 104 connected to the gas passage 38 for introducing the mixed raw material gases for Ba and Sr. The space 32B for Ti has a port 106 connected to the gas passage 46 for introducing the raw material gas for Ti. Oxygen gas used as an oxidizing gas and Ar gas are introduced into one or both of the spaces 32A and 32B. The spouting holes 102A and 102B consist of two groups, i.e., a group of spouting holes 102A connected to the space 32A for Ba and Sr, and a group of spouting holes 102B connected to the space 32B for Ti. The process gases spouted from the spouting holes 102A and 102B are mixed in the process field PF (in a manner of so called post-mixing supply).

The spouting holes 102A for spouting a process gas, which generates precursors having lower activation energies and higher resistivities, i.e., the process gas for Ba and Sr in this embodiment, have a constant diameter of, e.g., from about 1 to 2 mm, over the entirety of the shower region 100, and are uniformly distributed. Consequently, the process gas for Ba and Sr are uniformly spouted from the spouting holes 102A.

On the other hand, the spouting holes 102B for spouting a process gas, which generates precursors having higher activation energies and lower resistivities, i.e., the process gas for Ti in this embodiment, are uniformly distributed, but have diameters gradually decreasing in radial directions outward from the center of the shower region 100. Consequently, the process gas for Ti are spouted such that the gas supply amount or spouting amount is largest at the center and gradually decreases toward the periphery.

Figure 3:
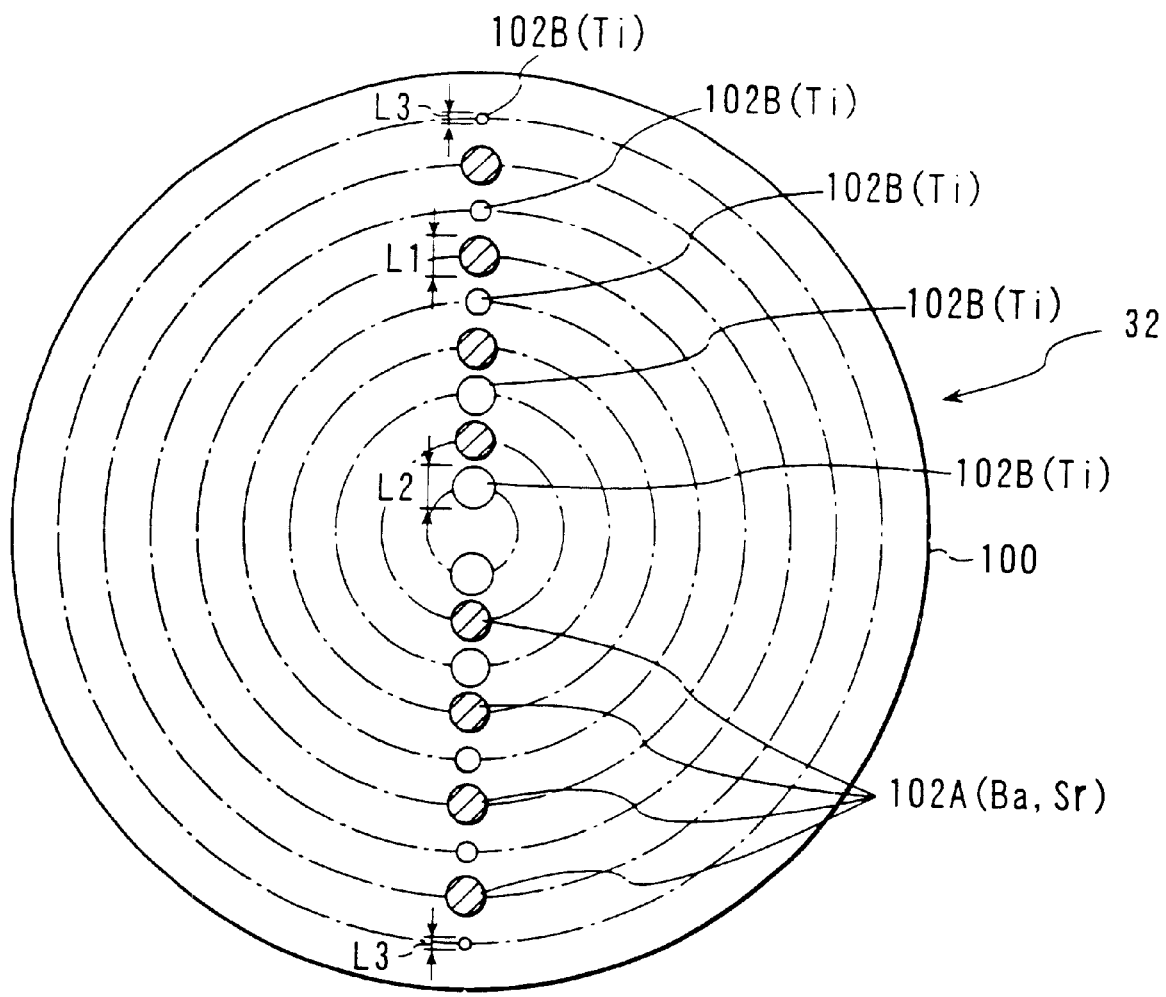
FIG. 3 is a view showing the shower region of a shower head employed in the CVD apparatus shown in FIG. 2.

In FIG. 3, the spouting holes 102A for the process gas for Ba and Sr, and the spouting holes 102B for the process gas for Ti are shown as circles with hatching and circles without hatching, respectively. The change in the diameters of the spouting holes 102B for Ti varies in accordance with gas types and process conditions for film deposition, so that the composition ratio of metal elements in the process gases maintains a high planar uniformity on the wafer surface during processing.

For example, where the wafer size is 8 inches, and the film deposition temperature is about 500° C., the spouting holes 102A for Ba and Sr have a constant diameter L1 of from about 1 to 2 mm, while the spouting holes 102B for Ti have diameters gradually decreasing in radial directions, such that a diameter L2 at the head center is from about 1.5 to 3 mm and a diameter L3 at the head periphery is from about 1 to 2 mm. Depending on process conditions, such as the gas flow rates and process pressure, L1 and L3 are set at values falling in a range of from 1 to 2 mm, and L2 is set at a value falling in a range of from 1.5 to 3 mm. The difference between L1 and L2 is set to be not more than 1.0 mm. Although the spouting holes 102A and 102B are arranged in a concentric format as shown in FIG. 3, they may be arranged in another format, such as a cross-strip format.

An explanation will be given to a CVD method performed in the CVD apparatus according to the first embodiment.

At first, a semiconductor wafer W is transferred from the load lock chamber 108 through the gate valve 106 into the process chamber 2, and mounted on the worktable 4. The wafer W is attracted and held on the worktable 4 by Coulomb's force generated by the electrostatic chuck 80, and is kept at a predetermined temperature of, e.g., from 400 to 600° C. by the resistance heating body 76. The process chamber 2 is kept at a predetermined pressure of, e.g., from 0.1 to 1 Torr, while the chamber 2 is vacuum-exhausted, but is supplied with the process gases.

As described above, the process gas containing Ba and Sr is introduced into the space 32A of the shower head 32 from the port 104, diffuses in the space 32A, and is spouted from the spouting holes 102A into the process field PF. At this time, an oxidizing gas (oxygen gas) and Ar gas are simultaneously supplied into the space 32A, and are mixed with the process gas to be spouted into the process field PF in a shower fashion. Since the spouting holes 102A have a constant diameter and are almost uniformly distributed in the shower region 100, the process gas containing mixed gases for Ba and SR is spouted at almost the same spouting rate per unit area over the entirety of the shower region 100.

On the other hand, the process gas containing Ti is introduced into the other space 32B of the shower head 32 from the port 106, diffuses in the space 32B, and is spouted from the spouting holes 102B into the process field PF. The process gas containing Ti is mixed with the process gas containing Ba and Sr in the process filed PF. Since the spouting holes 102B have diameters gradually decreasing in radial directions outward from the head center, the spouting rate from spouting holes 102B at the head center is larger than that from spouting holes 102B at the head periphery.

As described above, the process gas containing Ti, which is less reactive, is excessively supplied at the center and does not react so much due to its low reactivity. Consequently, the process gas containing Ti is transferred laterally and gradually spread onto the periphery of the wafer by means of diffusion or flow. The periphery is supplied with an insufficient amount of the process gas containing Ti due to the low spouting rate from above, but is supplemented with the Ti rich process gas flowing from the center. As a result, the composition ratio of the metal elements in the atmospheric gas on the wafer surface becomes almost the same between the center and the periphery. It follows that the film formed on the wafer surface can have an almost uniform composition ratio of the metal elements from the center to the periphery. Further, the gas amount on the wafer surface is not so different between the center and the periphery, and the film thickness can also be kept at a high planar uniformity.

Figure 6:
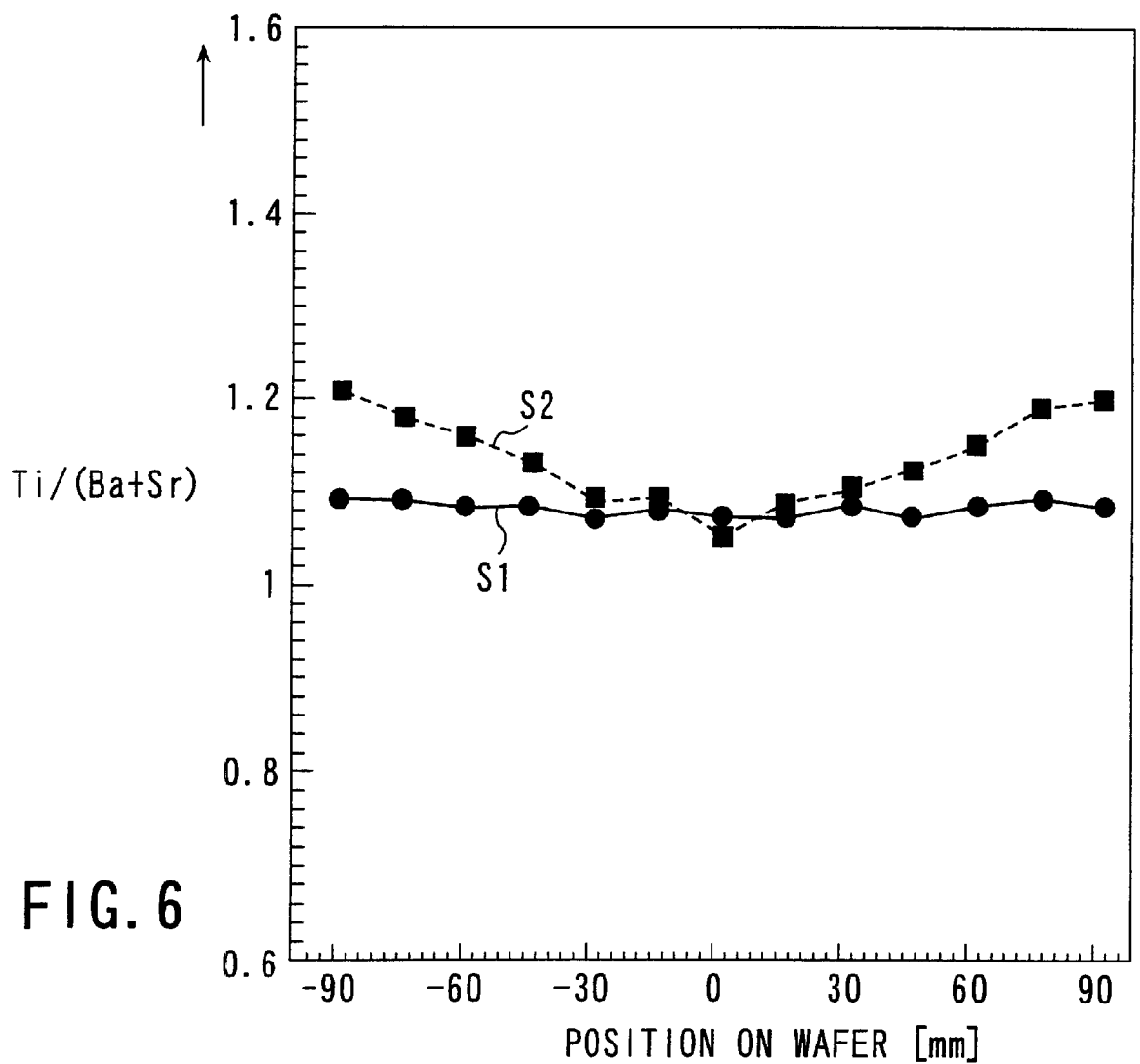
FIG. 6 is a graph showing relationships between the position on a wafer and Ti/(Ba+Sr) in BST thin films formed by a method according to the present invention and a conventional method.

FIG. 6 is a graph showing results of examining the composition of a film formed by an example S1 of a method according to the first embodiment of the present invention, and the composition of a film formed by a comparative example S2 of a conventional method. In FIG. 6, the horizontal and vertical axes denote the position on a wafer, and the ratio (relative value) of Ti to (Ba+Sr), respectively. The conventional method used here was a method in which the raw material gases for Ba, Sr, and Ti were all mixed in advance, and uniformly supplied from a shower head. The other conditions for film deposition in the example S1 and the comparative example S2 were set in common with each other. The conditions for the film deposition were as follows:

Wafer size: 8 inches,
Wafer temperature: 480° C.,
Film deposition pressure: 0.5 Torr,
Ba (thd)$_2$: 0.15 mol/L, 0.04 ml/min,
Sr (thd)$_2$: 0.15 mol/L, 0.04 ml/min,
Ti(O-ipr)$_2$(thd)$_2$: 0.25 mol/L, 0.12 ml/min,
Carrier gas Ar: 200 sccm,
)$_2$: 3 slm.

As shown in FIG. 6, the comparative example S2 shows a composition ratio which is gradually higher from the center of the wafer to the periphery, so the planar uniformity of the film composition is not so desirable. In contrast the example S1 shows a composition ratio, which is almost constant all over the wafer, so the planar uniformity of the film composition is desirable.

This desirable planar uniformity of the film composition is obtained by the above described method in which the process gas to generate precursors having higher reactivities is uniformly supplied all over the wafer, while the process gas to generate precursors having lower reactivities is supplied such that the gas supply amount is largest at the center and gradually decreases toward the periphery. In this case, the periphery of the wafer is supplied with the process gas to generate precursors having lower reactivities, which is the sum of the process gas from above and the process gas flowing from the center. As a result, a thin film of the composite material to be formed can have a high planar uniformity in the film thickness and the film composition.

Figure 4:
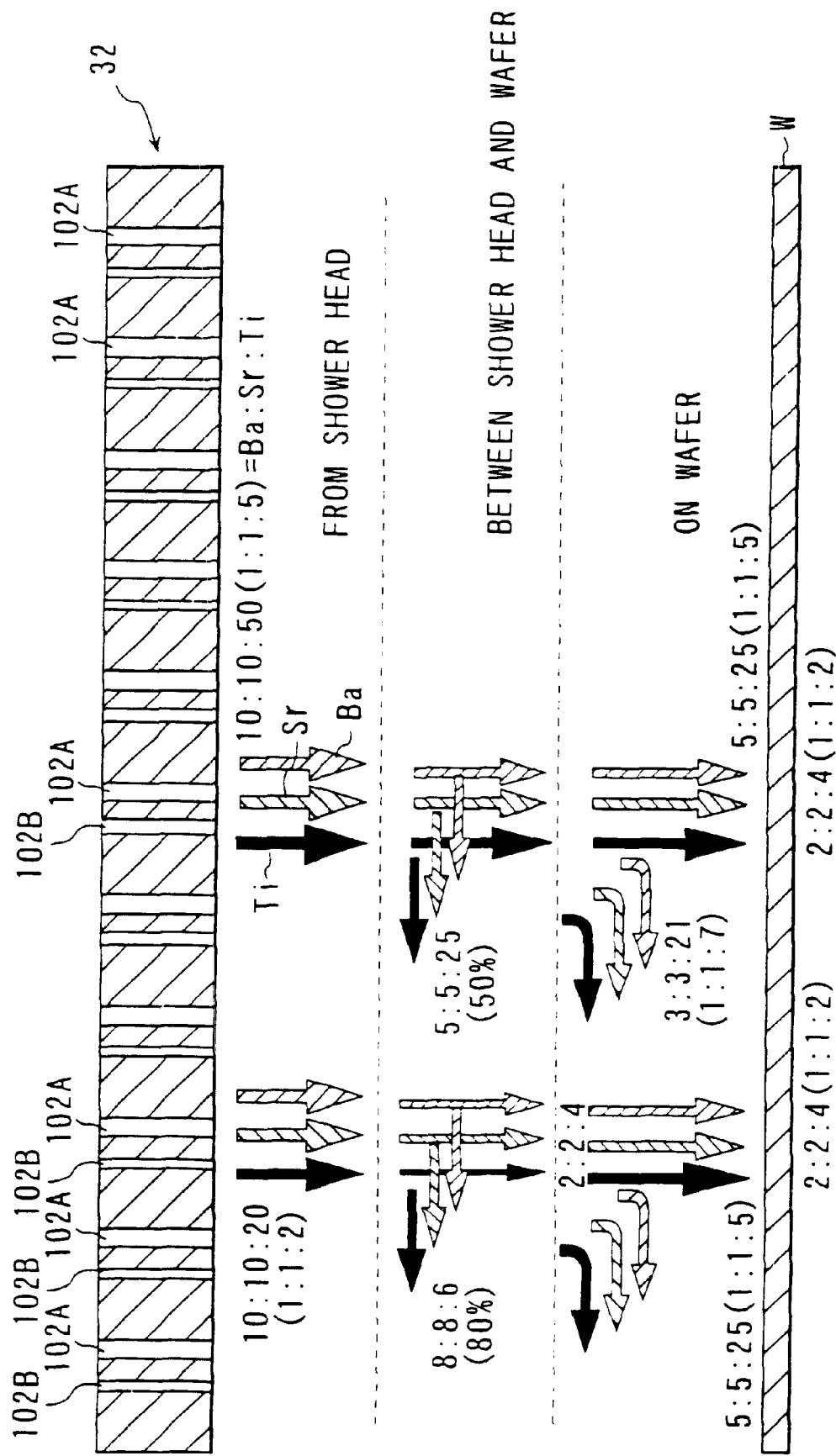
FIG. 4 is a view showing the flow and composition change of process gases spouted from the shower head of the CVD apparatus shown in FIG. 2.

FIG. 4 is a view showing the flow of the process gases spouted from the shower head, and their metal element ratios.

For example, it is supposed that the process gases are supplied from the spouting holes 102A for Ba and Sr, and the spouting holes 102B for Ti, at ratios in the flow rate and composition of Ba:Sr:Ti=10:10:50 (1:1:5) at the center of the shower head 32. Where there is a gas flow loss of 50% due to mass transfer in lateral directions, the process gases reach the center of the wafer surface at ratios in the rate and composition of Ba:Sr:Ti=5:5:25 (1:1:5). If the process gases are consumed at a ratio of Ba:Sr:Ti=2:2:4 (1:1:2) in the film deposition reaction, the process gases are left non-reacted at ratios in the rate and composition of Ba:Sr:Ti=3:3:21 (1:1:7). The non-reacted process gases flow outward in parallel to the wafer surface.

On the other hand, it is supposed that the spouting holes 102B for Ti have an opening area at the periphery of the shower head 32, which is two fifths smaller than that at the center. The process gases are supplied from the spouting holes 102A for Ba and Sr, and the spouting holes 102B for Ti, at ratios in the flow rate and composition of Ba:Sr:Ti=10:10:20 (1:1:2) at the periphery of the shower head 32. The process gases spouted from the periphery of the shower head 32 receive forces in lateral directions stronger than those to the gases at the center of the shower head 32. Where there is a gas flow loss of 80% due to mass transfer in lateral directions, the process gases reach the periphery of the wafer surface at ratios in the rate and composition of Ba:Sr:Ti=2:2:4 (1:1:2).

When the process gases flowing to the periphery of the wafer from above and the process gases flowing from the center join with each other, they form ratios in the rate and composition of Ba:Sr:Ti=5:5:25 (1:1:5), which are the same as those at the center of the wafer. Where the center and periphery of the wafer are provided with same film deposition conditions in other respects, the process gases are consumed at a ratio of Ba:Sr:Ti=2:2:4 (1:1:2) at the periphery of the wafer, as in the center of the wafer. Such a phenomenon is repeatedly caused from the center to the edge of the wafer surface, so both of the thickness and composition of the formed film can have a high planar uniformity, even if the wafer has a large size. The wafer is not limited to a specific size, but the present invention can be applied to a wafer having any size, such as 6, 8, or 12 inches.

The number of spouting holes 102A and 102B is about several hundreds in practice, depending on the size of a wafer to be processed, though only some of the spouting holes 102A and 102B are shown in the drawings. Accordingly, the diameters of the spouting holes 102B may gradually decrease stepwise in radial directions such that a certain number of spouting holes 102B belonging to each group have the same diameter, instead of the continuous decrease in diameter.

Figure 5:
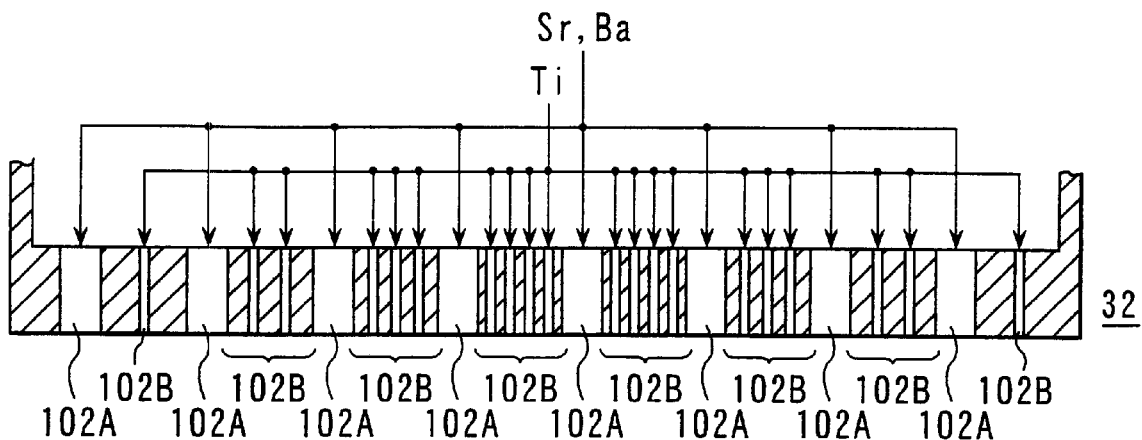
FIG. 5 is a cross-sectional view schematically showing a shower head according to a modification.

Although, in the first embodiment, the diameters of the spouting holes 102B are changed, the density of the spouting holes 102B may be changed, as shown in FIG. 5, to cause the gas spouting rate to vary. In FIG. 5, spouting holes 102B for Ti have the same diameter all over a shower head 32, but they are arranged to have a distribution density which gradually decreases in radial directions from the center to the periphery of a shower region 100. With this arrangement, the gas spouting rate for Ti also gradually decreases from the center to the periphery.

Although, in the first embodiment, oxygen gas and Ar gas are mixed only into the process gas for Ba and Sr, they may be mixed only into the process gas for Ti, or mixed into both of the process gases for Ba and Sr, and for Ti. Instead, the shower head may be provided with another space and spouting holes dedicated only to $O_2$ and Ar gas, so that the $O_2$ and Ar gas is independently supplied into the process field. This arrangement allows flow control to be relatively easily performed, and thus suits a case where the supply amount of $O_2$ and Ar gas is small.

Further, in the first embodiment, since precursors of Ba and Sr have similar activation energies, the raw material gases for the two metal elements are mixed with each other in advance and are supplied into the process field. This arrangement allows the number of liquid pumps and vaporizers to be small, and the number of spaces in the shower head to be reduced, thereby simplifying the apparatus. However, the shower head may be provided with separate spaces and spouting holes dedicated to the gas for Ba and the gas for Sr, respectively, so that the two gases are supplied into the process field independently of each other.

Although, in the first embodiment, a BST thin film is formed as a composite material thin film, the present invention may be applied to a process of forming a PZT thin film, which contains Pb, Ar, Ti, and O. The PZT is an oxide of Pb (lead), Zr (zirconium), and Ti (titanium), and presents a ferroelectric property when it has crystal of a perovskite structure. Where a PZT thin film is formed by an MOCVD method according to the present invention, raw materials, such as $Ti(iOPr)_4$=titanium tetraisopropoxide, $Zr(OtBt)_4$=tetra-t-butyl zirconium, and $Pb(DPM)_2$=bis(tetramethylheptanedionato)lead, and an oxidizing gas, such as $NO_2$, are used. Among precursors produced from the raw materials in film forming reaction, precursors for Ti and Zr have higher activation energies and lower reactivities, as compared to precursors for Pb.

The composition ratio of the PZT thin film is controlled to satisfy Pb/(Ti+Zr)=1, and 1<Ti/Zr. The Ti/Zr ratio is hard to control so as to fall in a certain variation range, over the surface of a wafer, relative to a reference ratio, such as 1.2. For example, with a conventional method, in which the raw material gases for Pb, Zr, and Ti are mixed with each other in advance of supply, it is difficult to allow the Ti/Zr ratio in the atmosphere on the wafer to have a planar uniformity of ±2% or less.

In contrast, according to the first embodiment of the present invention, the three raw material gases are supplied from a shower head, separately from each other, i.e., a gas for Pb, a gas for Zr and Ti, and a gas for $NO_2$. With this arrangement, the Ti/Zr ratio can be set at a target value within ±2% when supplied. Consequently, it is possible to form a PZT film having a high planar uniformity in the film composition, even where the wafer is large. A PZT film having a high planar uniformity in the film composition can have a uniform ferroelectric property, thereby providing a reliable device on the wafer.

In order to improve planar uniformity in film composition, the first embodiment may be also applied to a SBT thin film, i.e., a film of an oxide of Sr (strontium), Bi (bismuth), and Ta (tantalum), or a thin film further containing Nb (niobium) in addition to them, which is a ferroelectric body and attracts an attention as a promising material.

Figure 9:
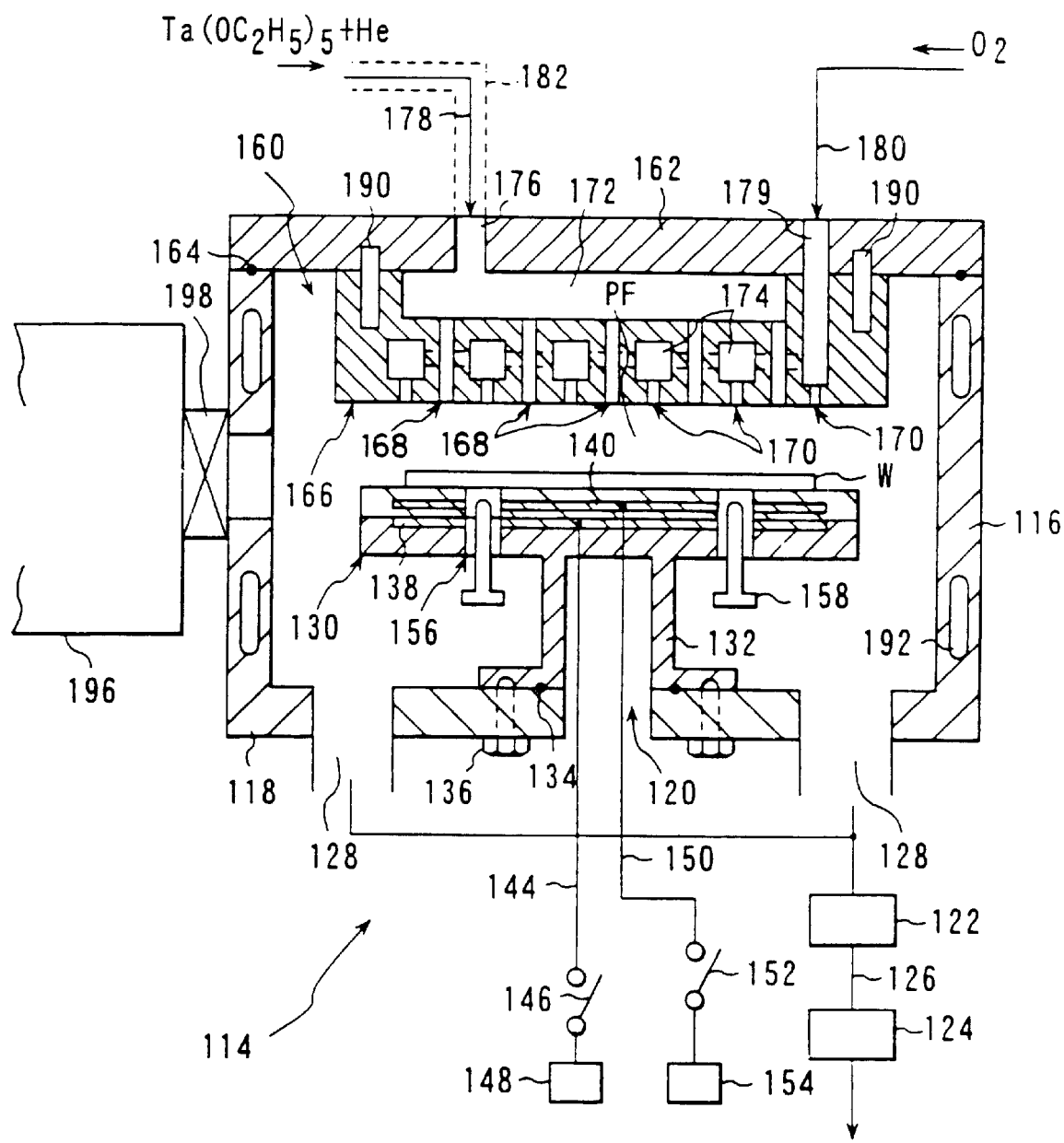
FIG. 9 is a diagram showing a CVD apparatus according to a second embodiment of the present invention.
Figure 10:
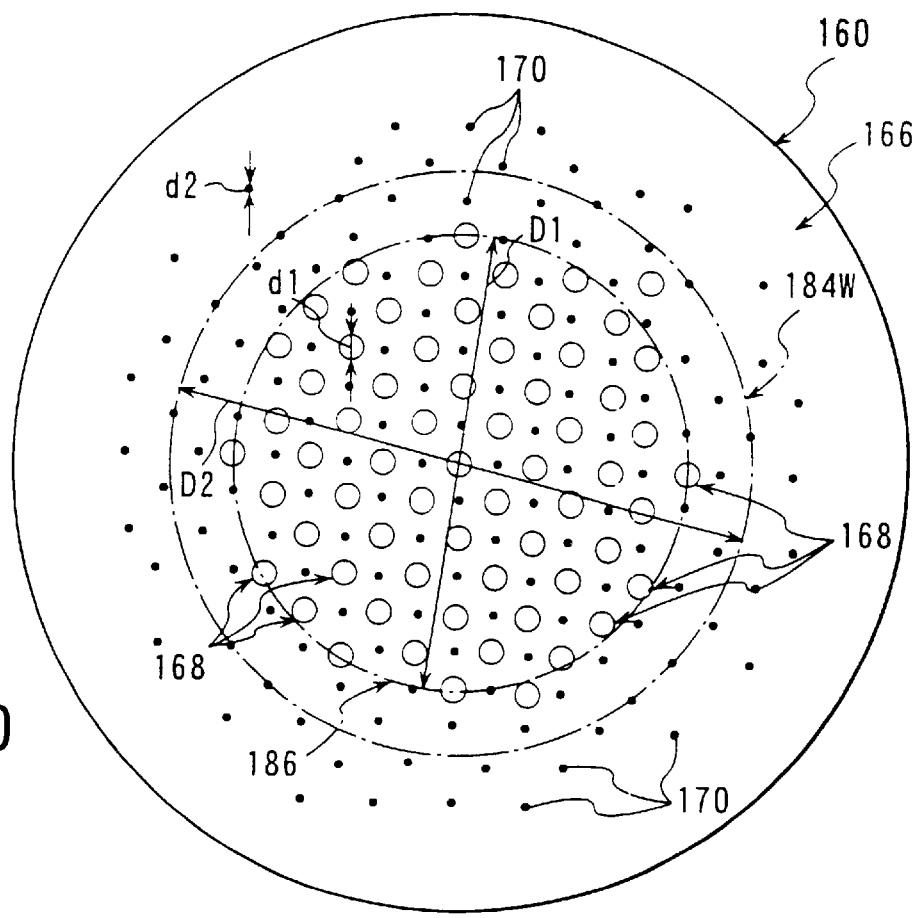
FIG. 10 is a plan view showing the bottom surface of a shower head shown in FIG. 9.

FIG. 9 is a diagram showing a CVD apparatus according to a second embodiment of the present invention. FIG. 10 is a plan view showing the bottom surface of a shower head shown in FIG. 9. In this embodiment, a $Ta_2O_5$ film is formed, using tantalum alkoxide, i.e., $Ta(OC_2H_5)_5$, as a raw material gas, and $O_2$ gas as an oxidizing gas.

This CVD apparatus 114 includes a process chamber 116 formed of a cylinder of, e.g., aluminum. In the bottom 118 of the process chamber 116, there is a lead-line guide hole 120 at the center, and exhaust ports 128 at the periphery. The exhaust ports 128 are connected to a vacuum-exhaust system 126 including pumps for vacuum-exhausting the inside of the process chamber 116, such as a turbo-molecular pump 122 and a dry pump 124. The exhaust ports 128 consist of a plurality of, e.g., four, exhaust ports 128 equidistantly arranged on one circle in the bottom 118, and connected to the common vacuum-exhaust system 126.

A load lock chamber 196 capable of being vacuum-exhausted is connected to a side wall of the process chamber 116 by a gate valve 198. A semiconductor wafer W is transferred into and out of the process chamber 116 through the load lock chamber 196. The process chamber 116 and the load lock chamber 196 are connected to a mechanism (not show) for supplying $N_2$ gas for purging.

A worktable 130 arranged in the process chamber 116 is a cylindrical table made of a non-conductive material, such as alumina. A leg portion 132 formed of a hollow cylinder is integratedly formed at the center of the bottom of the worktable 130 and extends downward. The lower end of the leg portion 132 is arranged to surround the guide hole 120 in the bottom 118 of the process chamber 116 and is airtightly connected and fixed to the bottom 118 by bolts 136 with a seal member 134, such as an O-ring, interposed therebetween. Consequently, the inside of the hollow leg portion 132 communicates with the outside of the process chamber 116, and is airtightly isolated from the inside of the process chamber 116.

Resistance heating bodies 138 and 140 made of, e.g., carbon coated with SiC, are embedded in the worktable 130. The temperature of the worktable 130 is controlled in two zones by the resistance heating bodies 138 and 140, so that the wafer W mounted thereon can be heated to a predetermined temperature.

The resistance heating bodies 138 and 140 are connected to lead lines 144 and 150, respectively, for supplying electricity, which are insulated from the members around them. The lead lines 144 and 150 are lead out to the outside of the process chamber 116 through the cylindrical leg portion 132 and the guide hole 120, without being exposed to the inside of the process chamber 116, and are connected to power supply sections 148 and 154 though switches 146 and 152, respectively. In place of the resistance heating bodies 138 and 140, a heating lamp, such as a halogen lamp, may be used for heating the wafer W.

A plurality of holes 156 are formed at positions on the periphery of the worktable 130 to penetrate the worktable 130, and lifter pins 158 are arranged in the holes 156 to be vertically movable. When the wafer W is transferred, the wafer W is moved in a vertical direction by an elevating mechanism (not shown) through the lifter pins 158. Generally, three lifter pins 158 are arranged to correspond to the periphery of the wafer W.

A shower head 160 is arranged on the ceiling of the process chamber 116 and has a ceiling plate 162 airtightly attached to the top of the process chamber 116 with a seal member 164, such as an O-ring, interposed therebetween. The shower head 160 has a bottom surface almost the same as or larger than the top surface of the worktable 130 to face and entirely cover it. A process field PF is defined between the shower head 160 and the worktable 130. The shower head 160 is provided with a number of spouting holes 168 and 170 in a shower region 166 on its bottom surface.

The inside of the shower head 160 is divided into two spaces, i.e., a space 172 for the raw material gas, and a space 174 for the oxidizing gas. The space 172 for the raw material gas has a port 176 connected to a raw material passage 178 extending from a bubbling apparatus (not shown) for introducing Ta(OC$_2$H$_5$)$_5$ which has been vaporized by bubbling with, e.g., He gas. The space 174 for Ti has a port 179 connected to the gas passage 180 for introducing O$_2$ gas. The spouting holes 168 and 170 consist of two groups, i.e., a group of spouting holes 168 connected to the space 172 for the raw material gas, and a group of spouting holes 170 connected to the space 174 for the oxidizing gas. The raw material gas and the oxidizing gas spouted from the spouting holes 168 and 102b are mixed in the process field PF (in a manner of so called post-mixing supply). The raw material passage 178 is surrounded by, e.g., a tape heater 182 to heat the gas flowing through the passage 178 at the liquefying temperature or more, so that the vaporized raw material gas is prevented from returning to a liquid state.

In conventional apparatuses, spouting holes 168 for a raw material gas and spouting holes 170 for an oxidizing gas are arranged to be essentially uniformly distributed in a zone having a surface area the same as or slightly larger than that of a wafer. However, in this apparatus according to the present invention, the spouting holes 168 for the raw material gas are arranged in a zone smaller than that for the spouting holes 170 for the oxidizing gas. Specifically, as shown in FIG. 10, the spouting holes 170 for the oxidizing gas are arranged to be essentially uniformly distributed in a circular zone 184W having a surface area the same as or slightly larger than that of the wafer W. On the other hand, the spouting holes 168 for the raw material gas are arranged to be essentially uniformly distributed in a circular zone 186, which is smaller than the zone 184W.

In order to prevent clogging, the spouting holes 168 generally have the same large diameter d1 of from 0.8 to 10 mm. The spouting holes 170 generally have the same small diameter d2 of from 0.2 to 0.3 mm. The distribution density per unit surface area of the groups of the spouting holes 168 and 170 are set to be about one/cm$^2$ and about one to three/cm$^2$, respectively.

Although the arranging zone 186 of the spouting holes 168 for the raw material gas is set to be smaller than that of conventional apparatuses, the raw material gas is supplied at a supply rate the same as that of the conventional apparatuses. Consequently, the spouting speed of the raw material gas from the spouting holes 168 is higher than that of the conventional apparatuses.

A cooling jacket 190 is formed in the side wall of the shower head 160, and supplied with a coolant, such as warm water of about 60° C. With this arrangement, the wall surface of the shower head 160 is kept at a temperature of, e.g., from 140 to 175° C., at which the raw material gas is prevented from being thermally dissociated while being prevented from returning to a liquid state. The distance between the shower head 160 and the worktable 130 is set at about from 10 to 30 mm.

A cooling jacket 192 is also formed in the side wall of the process chamber 116, and supplied with a coolant, such as warm water of about 60° C. With this arrangement, the wall surface of the process chamber 116 is kept at a temperature of, e.g., from 140 to 175° C., at which the raw material gas is prevented from being thermally dissociated while being prevented from returning to a liquid state.

An explanation will be given to a CVD method performed in the CVD apparatus according to the second embodiment.

At first, a semiconductor wafer W is transferred from the load lock chamber 196 through the gate valve 198 into the process chamber 116, and mounted on the worktable 130. The wafer W mounted on the worktable 130 is kept at a predetermined process temperature by the resistance heating bodies 138 and 140. The process chamber 116 is kept at a predetermined process pressure, while the chamber 116 is vacuum-exhausted, but is supplied with the process gases.

A liquid organic compound, Ta(OC$_2$H$_5$)$_5$, is vaporized by bubbling with He gas and supplied as the raw material gas. The supply rate of this gas is as small as, e.g., several mg/min, depending on deposition rate. The raw material gas flows once into the space 172 of the shower head 160, and then is supplied into the process field PF from the spouting holes 168, which are arranged in the shower region 166 and have a larger diameter.

On the other hand, the oxygen gas or O$_2$ gas flows once into the space 174 of the shower head 160, then is supplied into the process field PF from the spouting holes 170, which are arranged in the shower region 166 and have a smaller diameter. The raw material gas and O$_2$ gas are mixed and react with each other in the process field PF, so that a tantalum oxide (Ta$_2$O$_5$) film is deposited and formed. At this time, reaction byproducts, such as CH$_3$CHO, are produced.

For example, where the wafer W is an 8-inch wafer, the process pressure and process temperature of film deposition are set to be from about 0.2 to 0.3 Torr, and from about 250 to 450° C., e.g., 400° C., respectively. The supply rates of the material gas, He gas, and O$_2$ gas are set to be 15 mg/min, 300 sccm, and 1000 sccm, respectively.

According to the second embodiment, since the arranging zone 186 of the spouting holes 168 is smaller, the spouting speed of the raw material gas from the spouting holes 168 is increased. Consequently, the raw material gas reaches the wafer W without being thermally dissociated on the way, so that the concentration of the raw material gas increases and the concentration of reaction byproduct gases decreases on the wafer surface. Where the concentration of the byproducts, such as CH$_3$CHO, decreases on the wafer surface, the possibility of the byproducts being taken into the film to be formed is lowered, thereby the insulation breakdown voltage characteristic of the film is improved.

Where the arranging zone 186 of the spouting holes 168 and the zone 184W having almost the same surface area as the wafer W have diameters D1 and D2, respectively, the ratio D1/D2 is set to fall in a range of from 5/8 to 7/8. Where the ratio is smaller than 5/8, the spouting speed of the raw material gas is so increased that the concentration of the raw material gas at the center of the process field PF becomes too high. It follows that a metal oxide film comes to have a thickness larger at the wafer center, thereby deteriorating planar uniformity in the film thickness on the wafer. In contrast, where the ratio is larger than 7/8 to be closer to that of conventional apparatuses, reaction byproducts are not sufficiently prevented from being mixed into the film, thereby deteriorating the insulation breakdown voltage characteristic of the metal oxide film.

Note that, if the spouting speed of the raw material gas needs to be simply made high, it suffices that the supply pressure of the raw material gas is high. However, in this case, the supply rate of the raw material gas is greatly increased, and requires the supply rates of the other gases, such as He gas for bubbling and O$_2$ gas, to be greatly increased. Especially, where the wafer W is a 12-inch wafer, the gases have to be increased by a large amount; which does not work in practice.

Figure 11:
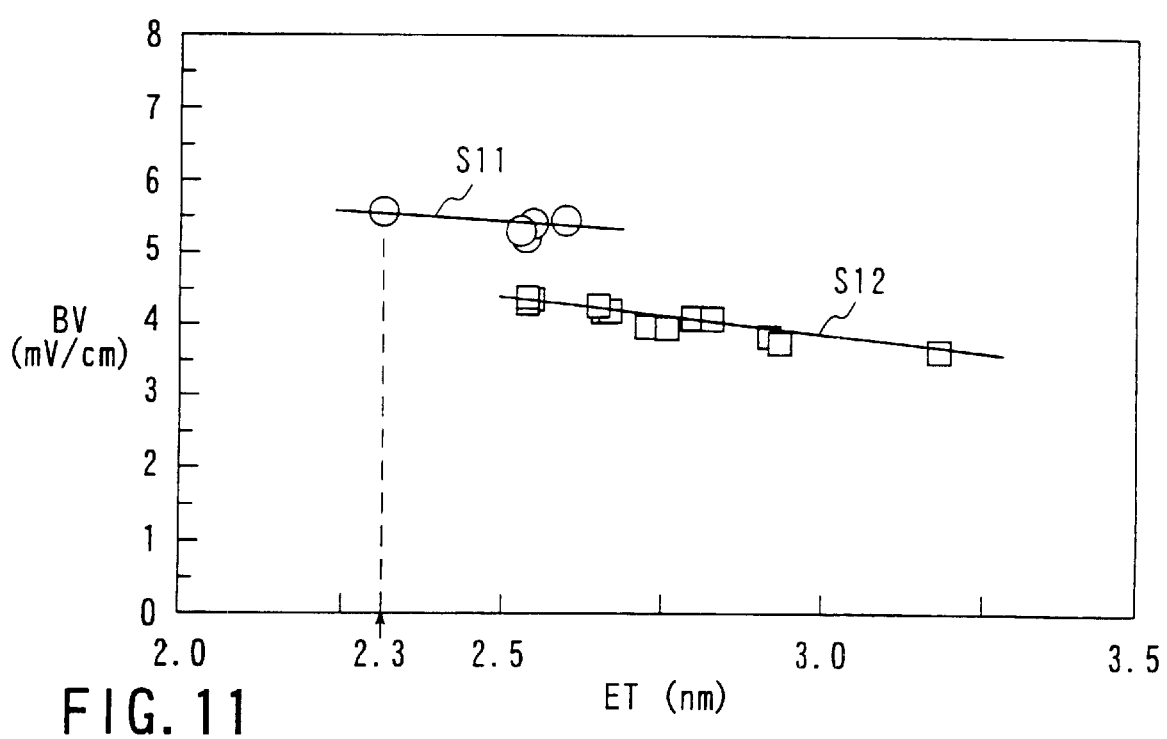
FIG. 11 is a graph showing the result of evaluating the insulation breakdown voltage of tantalum oxide films.

FIG. 11 is a graph showing the result of evaluating the insulation breakdown voltage of tantalum oxide films formed by an example S11 of a method according to the second embodiment of the present invention, and a comparative example S12 of a conventional method. In FIG. 11, the horizontal and vertical axes denote the effective film thickness ET, and the insulation breakdown voltage BV, respectively. The conventional method used here was a method in which both of the raw material gas and the oxidizing gas are supplied from spouting holes uniformly distributed in a zone having the same surface area as a wafer, i.e., the zone 184W shown in FIG. 10. The other conditions for film deposition in the example S11 and the comparative example S12 were set in common with each other. The conditions for the film deposition were as follows:

Wafer size: 6 inches,
Wafer temperature: 450° C.,
Film deposition pressure: 0.225 Torr,
$Ta(OC_2H_5)_5$: 15 mg/min
Carrier gas He: 250 sccm,
$O_2$: 1000 sccm,
Spouting holes 168:
within D1=4.5 inches (example S11)
within D2=6 inches (example S12)
Spouting holes 170:
within D2=6 inches (examples S11 and S12).

As shown in FIG. 11, the example S11 provides insulation breakdown voltages higher than those of the comparative example S12, and thus presents better properties, without reference to the film thickness. Especially, even where the effective film thickness is as thin as about 2.3 nm in the example 11, it provides a high insulation breakdown voltage.

Figure 12A:
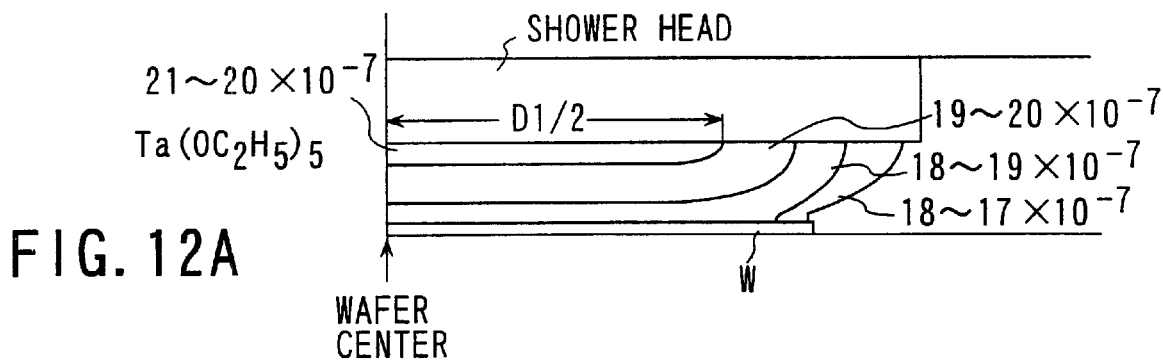
FIGS. 12A and 12B are views each showing the result of simulating the concentration distribution of a raw material gas ($Ta(OC_2H_5)_5$: Pet)
Figure 12B:
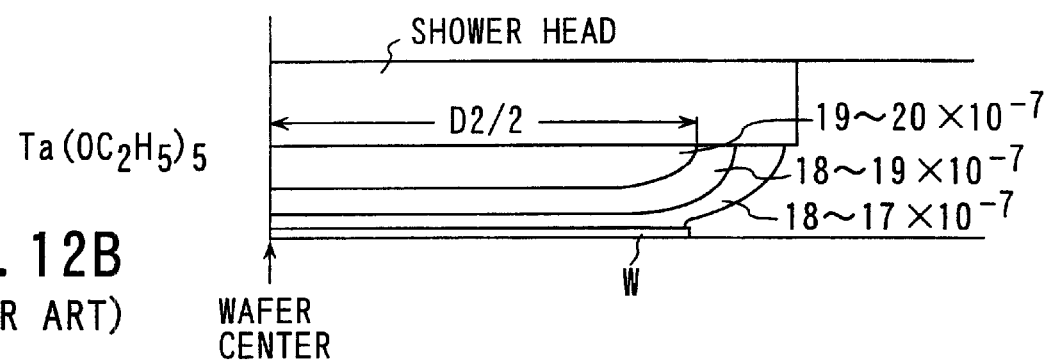
Figure 13A:
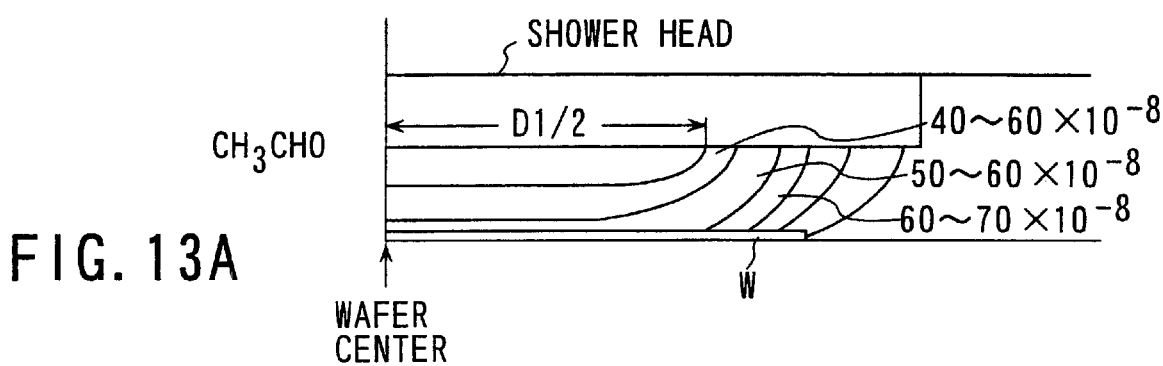
FIGS. 13A and 13B are views each showing the result of simulating the concentration distribution of a reaction byproduct ($CH_3CHO$)
Figure 13B:
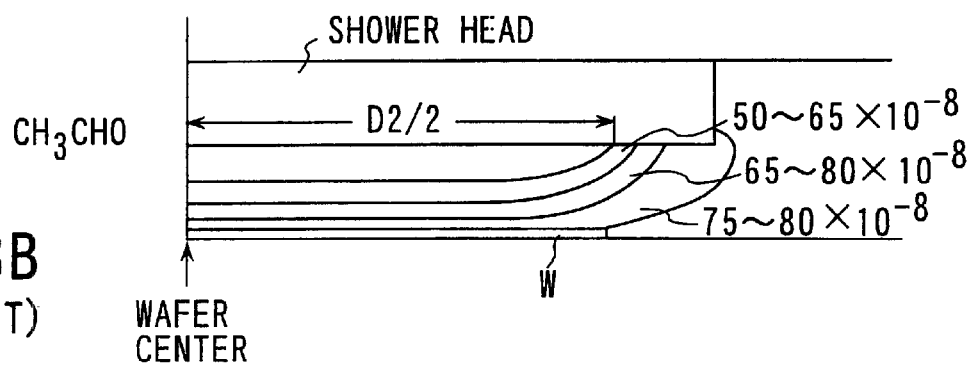

The concentration distribution of the raw material and a reaction byproduct below a shower head was simulated according to the apparatus of the present invention, and a conventional apparatus. In the apparatus of the present invention, the spouting holes 168 were uniformly arranged in the zone 186 with D1 of 6 inches, and the spouting holes 170 were uniformly arranged in the zone 184W with D2 of 8 inches, relative to an 8-inch wafer. In the conventional apparatus, each group of the spouting holes 168 and the spouting holes 170 were uniformly arranged in the zone 184 with D2 of 8 inches, relative to an 8-inch wafer. FIGS. 12A and 12B are views each showing the concentration distribution of the raw material gas ($Ta(OC_2H_5)_5$: Pet), according to the apparatus of the present invention, and the conventional apparatus, respectively. FIGS. 13A and 13B are views each showing the concentration distribution of the reaction byproduct ($CH_3CHO$), according to the apparatus of the present invention, and the conventional apparatus, respectively.

As shown in FIGS. 12A and 12B, the concentration of the raw material gas gradually decreases from the shower head 160 to the surface of the wafer W. In the apparatus of the present invention, as shown in FIG. 12A, the concentration of the raw material gas on the wafer is from about 1.8 to $1.9\times10^{-6}$ mol/m$^3$. In the conventional apparatus, as shown in FIG. 12B, the concentration of the raw material gas on the wafer is from about 1.7 to $1.8\times10^{-6}$ mol/m$^3$. Accordingly, in the apparatus of the present invention, more of the raw material gas reaches the wafer surface without being dissociated on the way.

As shown in FIGS. 13A and 13B, the concentration of the reaction byproduct gradually increases from the shower head 160 to the surface of the wafer W. In the apparatus of the present invention, as shown in FIG. 13A, the concentration of the reaction byproduct on the wafer is from about 50 to $60\times10^{-6}$ mol/m$^3$. In the conventional apparatus, as shown in FIG. 13B, the concentration of the reaction byproduct on the wafer is from about 75 to $80\times10^{-6}$ mol/m$^3$. Accordingly, in the apparatus of the present invention, the reaction byproduct is more efficiently exhausted, due to a higher spouting speed of the raw material gas.

Figure 14:
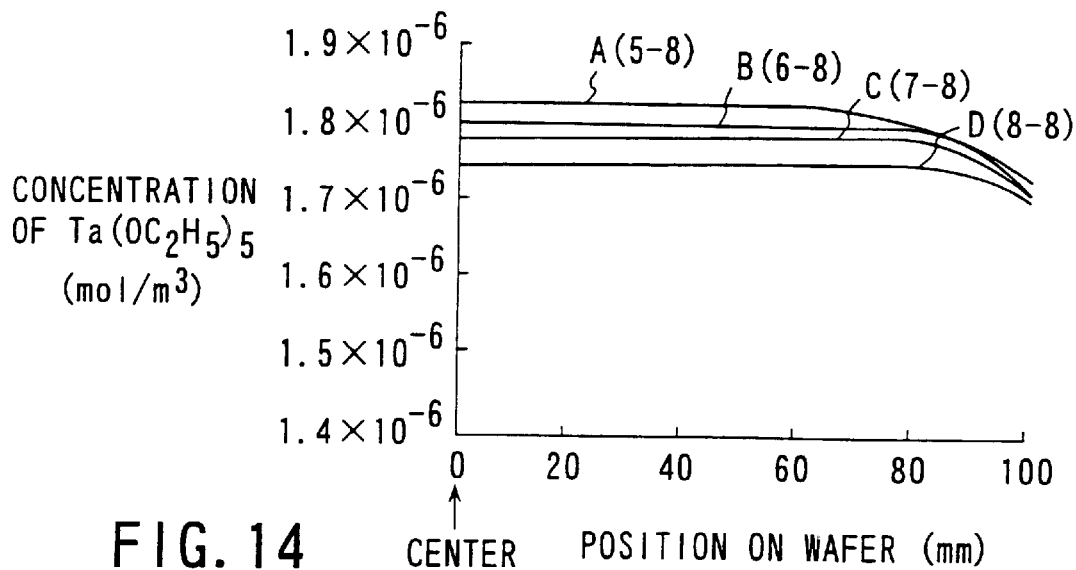
FIG. 14 is a graph showing the result of simulating the concentration distribution of the raw material gas.
Figure 15:
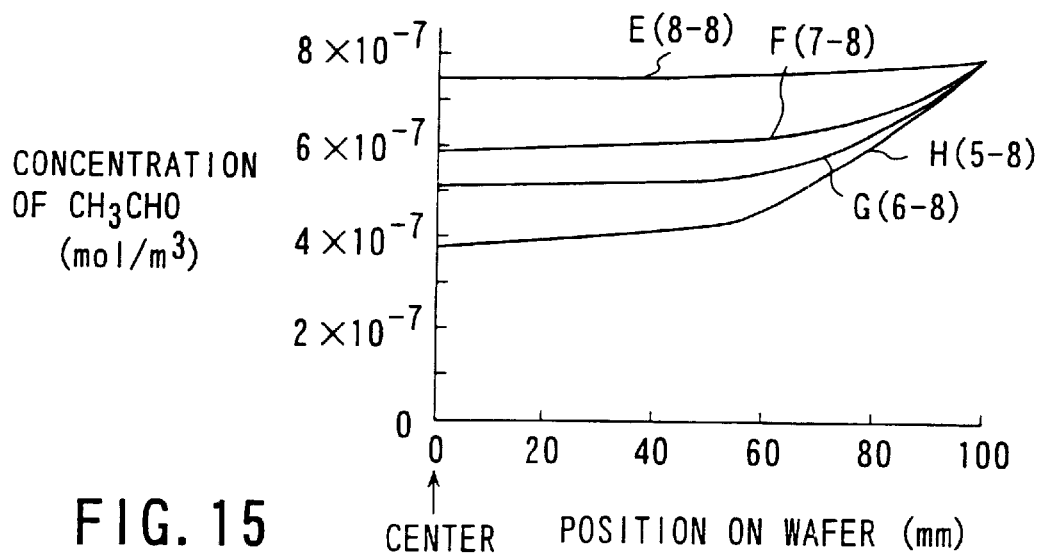
FIG. 15 is a graph showing the result of simulating the concentration distribution of the reaction byproduct.
Figure 16:
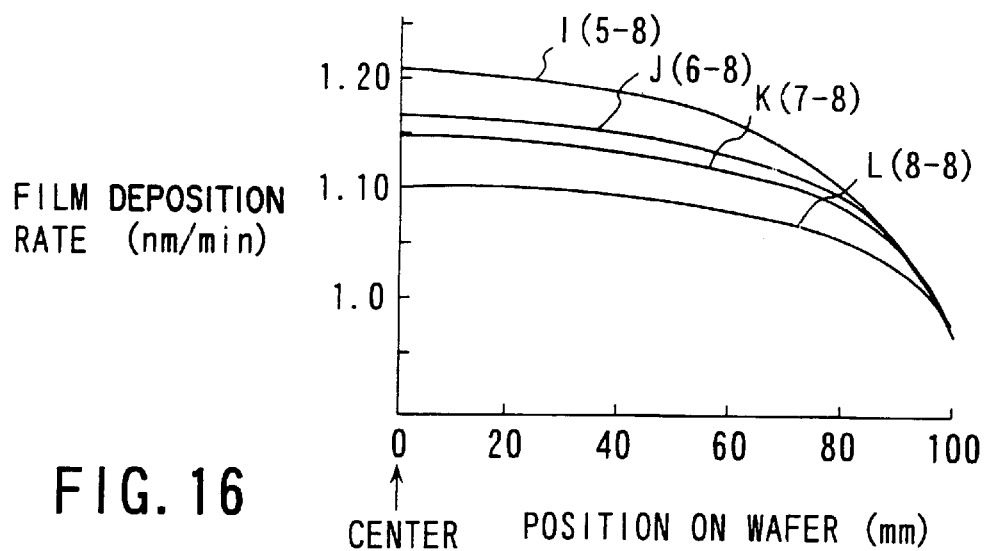
FIG. 16 is a graph showing the result of simulating the deposition rate of tantalum oxide films.

Other simulations were conducted, while changing the diameter D1 (see FIG. 10) of the arranging zone of the spouting holes 168 for the raw material gas. The results of the simulations will be explained with reference to FIGS. 14 to 16. In the simulations, an 8-inch wafer was used, while the arranging zone of the spouting holes 170 for the oxidizing gas was set to have a diameter D2 of 8 inches. FIGS. 14 to 16 include numerals shown along the lines A to L in which the numerals on the left side denote the diameter D1 (inch) of the arranging zone of the spouting holes 168 and the numerals on the right side denote the diameter D2 (inch) of the arranging zone of the spouting holes 170. For example, the symbol (8-8) corresponds to the shower head of the conventional apparatus, and the symbol (6-8) corresponds to the shower head of a typical apparatus of the present invention.

FIG. 14 is a graph showing the concentration distribution of the raw material gas ($Ta(OC_2H_5)_5$: Pet). As shown in FIG. 14, the concentration of the raw material gas decreases rapidly within a portion of from 80 to 100 mm from the center of the wafer. The line D (8-8) representing the conventional apparatus shows an undesirably low concentration of the raw material gas within a portion of 0 to 80 mm from the center of the wafer. On the other hand, the lines C, B, and A show desirable results such that the concentrations of the raw material gas on the wafer in those cases are higher than that of the line D, and the concentrations increase in the order of the lines C, B, and A, i.e., with a decrease in the diameter D1.

FIG. 15 is a graph showing the concentration distribution of the reaction byproduct ($CH_3CHO$). As shown in FIG. 15, the line E (8-8) representing the conventional apparatus generally shows an undesirable concentration of the reaction byproduct as high as $7.0\times10^{-7}$ mol/m$^3$ or more. On the other hand, the lines F to H according to the present invention show desirable concentrations of the reaction byproduct from the center to the periphery of the wafer as low as $6.0\times10^{-7}$ mol/m$^3$ or less. Further, in the order of the lines F to H, the concentrations of the reaction byproduct become lower, while the concentrations increase more at the periphery of the wafer. Accordingly, it has been found that, with a decrease in the diameter D1 (see FIG. 10), the spouting speed of the raw material gas increases so that the reaction byproduct is exhausted more effectively at the center and periphery of the wafer.

FIG. 16 is a graph showing the deposition rate of tantalum oxide films. As shown in FIG. 16, the line L (8-8) representing the conventional apparatus shows deposition rates of 1.10 nm/min and 0.95 nm/min, at the center and periphery of the wafer, respectively. The difference between the deposition rates at the center and periphery of the wafer is preferably small. On the other hand, the lines K to I according to the present invention show increasingly higher deposition rates in the order of the lines K to I, because the concentration of the raw material gas is higher at the center of the wafer, as described above. In the case of the line I showing the highest deposition rate, the deposition rate at the center of the wafer is 1.20 nm/min, while that at the periphery is 0.95 nm/min.

Even in the case of the line I, however, the difference between the deposition rates at the center and periphery of the wafer is 0.25 nm/min. Such a difference does not deteriorate planar uniformity in the film thickness so much, but is thus permissible. It is not preferable, however, to enlarge the difference any more between the deposition rates at the center and periphery of the wafer, thereby deteriorating planar uniformity in the film thickness. Judging from the above described results, the ratio D1/D2 between the diameters D1 and D2 shown in FIG. 10 should be set to fall in a range of from 5/8 to 7/8, and preferably at about 6/8.

Although the simulations were performed on 8-inch wafers, the ratio of D1/D2 is not limited for the wafer size, but can be applied to wafers of other sizes, such as 12 inches and 6 inches.

In the second embodiment, $O_2$ is used as the oxidizing gas, but $O_3$, $NO_2$, NO, or vaporized alcohol may be used instead. The second embodiment may be applied to a case where a film of a metal nitride, such as TiN or WN, or a film of a metal, such as Pt, Ru, Ir, or Ti, is deposited. In this case, such the following complex compounds may be used as raw material gases containing a metal. Those are tris(pentanedionato)iridium=$(C_5H_7O_2)_3Ir$; tetrakis(diethyl-amido) titanium=$[(CH_3CH_2)_2N]_4Ti$; bis(cyclopenta-dienyl) ruthenium=$(C_5H_5)_2Ru$, methylcyclopenta-dienyl(trimethyl) olatinum=$(CH_3C_3H_4)(CH_3)_3Pt$.

Further, it is possible to apply the concept of the second embodiment to a process of forming a BST film, a PZT film, and the like, mentioned with reference to the first embodiment.

For example, where a BST film is formed, a first process gas comprising $Ba(thd)_2$ and $Sr(thd)_2$, and a second process gas comprising $Ti(O-iPr)(thd)_2$ or $Ti(thd)_2$ are supplied from a narrower zone 186 (see FIG. 10), while a third gas comprising an oxidizing gas, e.g., $NO_2$ is supplied from a wider zone 184W (see FIG. 10). In this case, the concept of the first embodiment may be further applied to this process, such that the first and second gases are supplied from spouting holes different from each other wherein the first gas is supplied from spouting holes 102A (see FIG. 3) at a spouting rate substantially uniform all over, while the second process gas is supplied from spouting holes 102B (see FIG. 3) at a spouting rate gradually decreasing in radial directions outward.

Where a PZT film is formed, a first process gas comprising $Pb(DPM)_2$, and a second process gas comprising $Zr(OtBt)_4$ and $Ti(iOPr)_4$ are supplied from a narrower zone 186 (see FIG. 10), while a third gas comprising an oxidizing gas, e.g., $NO_2$ is supplied from a wider zone 184W (see FIG. 10). In this case, the concept of the first embodiment may be further applied to this process, such that the first and second gases are supplied from spouting holes different from each other wherein the first gas is supplied from spouting holes 102A (see FIG. 3) at a spouting rate substantially uniform all over, while the second process gas is supplied from spouting holes 102B (see FIG. 3) at a spouting rate gradually decreasing in radial directions outward.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A single-substrate-processing CVD method of forming a film containing a metal element on a target substrate while supplying first and second process gases containing said metal element and a nonmetal element for combining with said metal element, respectively, said method comprising:
    placing said target substrate on a worktable arranged in an airtight process chamber; and
    forming said film on said target substrate by supplying said first and second process gases into said process chamber from a shower region facing said worktable while exhausting said process chamber, wherein said first process gas is supplied from a first zone having a surface area substantially smaller than a surface area of said target substrate facing said shower region such that said first process gas is supplied at a spouting speed higher than a spouting speed at which said first process gas would be supplied from a zone having the same surface area as said surface area of said target substrate when an equal supply rate is used, and said second process gas is supplied from a second zone concentric with said first zone and including said first zone and having a surface area substantially the same as or larger than said surface area of said target substrate.

2. The method according to claim 1, wherein, in forming said film, said first and second process gases are supplied from said shower region without being mixed with each other in advance.

3. The method according to claim 1, wherein a ratio of the surface area of said first zone to said surface area of said target substrate falls in a range of from 5/8 to 7/8.

4. The method according to claim 1, wherein said first and second process gases comprise an organic metal and an oxidizing gas, respectively, and wherein, in forming said film, said target substrate is heated.

5. The method according to claim 4, wherein said first process gas comprises $Ta(OC_2H_5)_5$, and said film consists of $Ta_2O_5$.

6. The method according to claim 1, wherein first holes for spouting said first process gas are substantially uniformly distributed in said first zone, and second holes for spouting said second process gas are substantially uniformly distributed in said second zone.

7. A single-substrate-processing CVD method of forming a film containing metal elements on a target substrate while supplying first and second process gases containing said metal elements, respectively, and a third process gas containing a non-metal element for combining with said metal elements, without mixing said first, second, and third process gases with each other in advance, said method comprising: placing said target substrate on a worktable arranged in an airtight process chamber; and forming said film on said target substrate by supplying said first, second and third process gases into said process chamber from a shower region facing said worktable while exhausting said process chamber,
    wherein said first and second process gases are supplied from a first zone having a surface area substantially smaller than a surface area of said target substrate facing said shower region such that each of said first and second process gases is supplied at a spouting speed higher than a spouting speed at which each of said first and second process gas would be supplied from a zone having the same surface area as said surface area of said target substrate when an equal supply rate is used, and said third process gas is supplied from a second zone concentric with said first zone and including said first zone and having a surface area substantially the same as or larger than said surface area of said target substrate.

8. The method according to claim 7, wherein said first process gas comprises $Ba(thd)_2$ and $Sr(thd)_2$, said second process gas comprises $Ti(O-iPr)_2(thd)_2$ or $TiO(thd)_2$, and said third gas comprises $NO_2$.

9. The method according to claim 7, wherein said first process gas comprises $Pb(DPM)_2$, said second process gas comprises $Zr(OtBt)_4$ and $Ti(iOPr)_4$, and said third gas comprises $NO_2$.

* * * * *